(12) United States Patent
Grisamore et al.

(10) Patent No.: US 8,536,799 B1
(45) Date of Patent: Sep. 17, 2013

(54) DIMMER DETECTION

(75) Inventors: Robert T. Grisamore, Austin, TX (US);
Firas S. Azrai, Austin, TX (US); Mohit Sood, Austin, TX (US); John L. Melanson, Austin, TX (US); Eric J. King, Dripping Springs, TX (US); Jean-Charles Pina, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 161 days.

(21) Appl. No.: 13/077,483

(22) Filed: Mar. 31, 2011

Related U.S. Application Data

(60) Provisional application No. 61/413,164, filed on Nov. 12, 2010, provisional application No. 61/369,202, filed on Jul. 30, 2010.

(51) Int. Cl.
*H05B 37/02* (2006.01)

(52) U.S. Cl.
USPC .................. 315/294; 315/185 R; 315/200 R; 315/291

(58) Field of Classification Search
USPC ............. 315/291–297, 287, 192, 210, 185 R, 315/200 R; 363/126
See application file for complete search history.

(56) References Cited

U.S. PATENT DOCUMENTS

| | | | |
|---|---|---|---|
| 3,316,495 A | 4/1967 | Sherer | |
| 3,423,689 A | 1/1969 | Miller et al. | |
| 3,586,988 A | 6/1971 | Weekes | |
| 3,725,804 A | 4/1973 | Langan | |
| 4,409,476 A | 10/1983 | Lofgren et al. | |
| 4,523,128 A | 6/1985 | Stamm | |
| 4,937,728 A | 6/1990 | Leonardi | |
| 4,980,898 A | 12/1990 | Silvian | |
| 5,001,620 A | 3/1991 | Smith | |

(Continued)

FOREIGN PATENT DOCUMENTS

| | | |
|---|---|---|
| DE | 19713814 | 10/1998 |
| EP | 0632679 | 1/1995 |

(Continued)

OTHER PUBLICATIONS

Azoteq, IQS17 Family, IQ Switch—ProxSense Series, Touch Sensor, Load Control and User Interface, IQS17 Datasheet V2.00.doc, Jan. 2007, pp. 1-51, Azoteq (Pty) Ltd., Paarl, Western Cape, Republic of South Africa.

(Continued)

*Primary Examiner* — Vibol Tan
(74) *Attorney, Agent, or Firm* — Terrile, Cannatti, Chambers & Holland, LLP; Kent B. Chambers

(57) ABSTRACT

In at least one embodiment, a lighting system receives an input signal, such as a supply voltage, that can be affected by a dimmer. The supply voltage can be affected by a dimmer when, for example, a dimmer phase cut (i.e. chopped) the supply voltage. A dimmer detection system of the lighting system determines if a dimmer is affecting the supply voltage. In at least one embodiment, the dimmer detection system also determines a type of the dimmer, such as detecting if the dimmer is a leading edge or trailing edge dimmer. In at least one embodiment, the dimmer detection system provides dimmer type data to one or more other circuits such as a switching power converter controller. The one or more other circuits utilize the dimmer type data to affect their operation.

26 Claims, 18 Drawing Sheets

(56) References Cited

U.S. PATENT DOCUMENTS

| | | |
|---|---|---|
| 5,055,746 A | 10/1991 | Hu et al. |
| 5,109,185 A | 4/1992 | Ball |
| 5,121,079 A | 6/1992 | Dargatz |
| 5,264,780 A | 11/1993 | Bruer et al. |
| 5,319,301 A | 6/1994 | Callahan et al. |
| 5,424,932 A | 6/1995 | Inou et al. |
| 5,479,333 A | 12/1995 | McCambridge et al. |
| 5,589,759 A | 12/1996 | Borgato et al. |
| 5,757,635 A | 5/1998 | Seong |
| 5,764,039 A | 6/1998 | Choi et al. |
| 5,768,111 A | 6/1998 | Zaitsu |
| 5,798,635 A | 8/1998 | Hwang et al. |
| 5,912,812 A | 6/1999 | Moriarty, Jr. |
| 5,946,206 A | 8/1999 | Shimizu et al. |
| 5,960,207 A | 9/1999 | Brown |
| 5,962,989 A | 10/1999 | Baker |
| 6,091,233 A | 7/2000 | Hwang |
| 6,125,046 A | 9/2000 | Jang et al. |
| 6,181,114 B1 | 1/2001 | Hemena et al. |
| 6,229,292 B1 | 5/2001 | Redl et al. |
| 6,343,026 B1 | 1/2002 | Perry |
| 6,369,525 B1 | 4/2002 | Chang et al. |
| 6,407,514 B1 | 6/2002 | Glaser et al. |
| 6,407,515 B1 | 6/2002 | Hesler et al. |
| 6,469,484 B2 | 10/2002 | L'Hermite et al. |
| 6,531,854 B2 | 3/2003 | Hwang |
| 6,628,106 B1 | 9/2003 | Batarseh et al. |
| 6,646,848 B2 | 11/2003 | Yoshida et al. |
| 6,657,417 B1 | 12/2003 | Hwang |
| 6,688,753 B2 | 2/2004 | Calon et al. |
| 6,713,974 B2 | 3/2004 | Patcharnik et al. |
| 6,724,174 B1 | 4/2004 | Esteves et al. |
| 6,737,845 B2 | 5/2004 | Hwang |
| 6,756,772 B2 | 6/2004 | McGinnis |
| 6,858,995 B2 | 2/2005 | Lee et al. |
| 6,900,599 B2 | 5/2005 | Ribarich |
| 6,963,496 B2 | 11/2005 | Bimbaud |
| 6,975,523 B2 | 12/2005 | Kim et al. |
| 6,980,446 B2 | 12/2005 | Simada et al. |
| 7,034,611 B2 | 4/2006 | Oswal et al. |
| 7,072,191 B2 | 7/2006 | Nakao et al. |
| 7,099,163 B1 | 8/2006 | Ying |
| 7,102,902 B1 | 9/2006 | Brown et al. |
| 7,126,288 B2 | 10/2006 | Ribarich et al. |
| 7,180,250 B1 | 2/2007 | Gannon |
| 7,246,919 B2 | 7/2007 | Porchia et al. |
| 7,276,861 B1 | 10/2007 | Shteynberg et al. |
| 7,345,458 B2 | 3/2008 | Kanai et al. |
| 7,375,476 B2 | 5/2008 | Walter et al. |
| 7,388,764 B2 | 6/2008 | Huynh et al. |
| 7,394,210 B2 | 7/2008 | Ashdown |
| 7,511,437 B2 | 3/2009 | Lys et al. |
| 7,583,136 B2 | 9/2009 | Pelly |
| 7,656,103 B2 | 2/2010 | Shteynberg et al. |
| 7,667,986 B2 | 2/2010 | Artusi et al. |
| 7,710,047 B2 | 5/2010 | Shteynberg et al. |
| 7,719,246 B2 * | 5/2010 | Melanson ............. 323/282 |
| 7,719,248 B1 | 5/2010 | Melanson |
| 7,746,043 B2 | 6/2010 | Melanson |
| 7,746,671 B2 | 6/2010 | Radecker et al. |
| 7,750,738 B2 | 7/2010 | Bach |
| 7,756,896 B1 | 7/2010 | Feingold |
| 7,759,881 B1 | 7/2010 | Melanson |
| 7,777,563 B2 | 8/2010 | Midya et al. |
| 7,804,256 B2 | 9/2010 | Melanson |
| 7,804,480 B2 | 9/2010 | Jeon et al. |
| 7,872,427 B2 | 1/2011 | Scianna |
| 8,169,154 B2 | 5/2012 | Thompson et al. |
| 8,212,491 B2 | 7/2012 | Kost et al. |
| 8,222,832 B2 * | 7/2012 | Zheng et al. ............. 315/291 |
| 2002/0065583 A1 | 5/2002 | Okada |
| 2003/0174520 A1 | 9/2003 | Bimbaud |
| 2004/0004465 A1 | 1/2004 | McGinnis |
| 2004/0105283 A1 | 6/2004 | Schie et al. |
| 2005/0168492 A1 | 8/2005 | Hekstra et al. |
| 2005/0197952 A1 | 9/2005 | Shea et al. |
| 2005/0222881 A1 | 10/2005 | Booker |
| 2006/0002110 A1 | 1/2006 | Dowling |
| 2006/0116898 A1 | 6/2006 | Peterson |
| 2006/0184414 A1 | 8/2006 | Pappas et al. |
| 2006/0214603 A1 | 9/2006 | Oh et al. |
| 2006/0238136 A1 | 10/2006 | Johnson et al. |
| 2006/0285365 A1 | 12/2006 | Huynh et al. |
| 2007/0024213 A1 | 2/2007 | Shteynberg et al. |
| 2007/0055564 A1 | 3/2007 | Fourman |
| 2007/0124615 A1 | 5/2007 | Orr |
| 2007/0126656 A1 | 6/2007 | Huang et al. |
| 2007/0182338 A1 | 8/2007 | Shteynberg et al. |
| 2007/0182347 A1 | 8/2007 | Shteynberg et al. |
| 2007/0285031 A1 | 12/2007 | Shteynberg et al. |
| 2008/0012502 A1 | 1/2008 | Lys |
| 2008/0027841 A1 | 1/2008 | Eder |
| 2008/0043504 A1 | 2/2008 | Ye et al. |
| 2008/0054815 A1 | 3/2008 | Kotikalapoodi et al. |
| 2008/0116818 A1 | 5/2008 | Shteynberg et al. |
| 2008/0130322 A1 | 6/2008 | Artusi et al. |
| 2008/0130336 A1 | 6/2008 | Taguchi |
| 2008/0150433 A1 | 6/2008 | Tsuchida et al. |
| 2008/0154679 A1 | 6/2008 | Wade |
| 2008/0174291 A1 | 7/2008 | Hansson et al. |
| 2008/0175029 A1 | 7/2008 | Jung et al. |
| 2008/0224629 A1 | 9/2008 | Melanson |
| 2008/0224633 A1 | 9/2008 | Melanson |
| 2008/0232141 A1 | 9/2008 | Artusi et al. |
| 2008/0239764 A1 | 10/2008 | Jacques et al. |
| 2009/0067204 A1 | 3/2009 | Ye et al. |
| 2009/0070188 A1 | 3/2009 | Scott et al. |
| 2009/0174479 A1 | 7/2009 | Yan et al. |
| 2009/0284182 A1 | 11/2009 | Cencur |
| 2010/0013405 A1 | 1/2010 | Thompson |
| 2010/0013409 A1 | 1/2010 | Quek et al. |
| 2010/0141317 A1 | 6/2010 | Szajnowski |
| 2010/0164406 A1 | 7/2010 | Kost et al. |
| 2010/0213859 A1 | 8/2010 | Shteynberg |
| 2010/0244726 A1 | 9/2010 | Melanson |
| 2011/0043133 A1 * | 2/2011 | Van Laanen et al. ......... 315/294 |
| 2011/0121754 A1 | 5/2011 | Shteynberg |
| 2011/0266968 A1 * | 11/2011 | Bordin et al. ................ 315/287 |

FOREIGN PATENT DOCUMENTS

| | | |
|---|---|---|
| EP | 0838791 | 4/1998 |
| EP | 1164819 | 12/2001 |
| EP | 1460775 | 9/2004 |
| EP | 2257124 A1 | 1/2010 |
| EP | 2204905 A1 | 7/2010 |
| EP | 2232949 | 9/2010 |
| EP | 2257124 | 12/2010 |
| GB | 2069269 A | 8/1981 |
| JP | 2008053181 A | 3/2008 |
| WO | WO9725836 | 7/1997 |
| WO | 01/15316 A1 | 1/2001 |
| WO | 02/15386 A2 | 2/2002 |
| WO | 02096162 A1 | 11/2002 |
| WO | WO2006013557 | 2/2006 |
| WO | 2006079937 | 8/2006 |
| WO | 2008029108 | 3/2008 |
| WO | WO2008072160 | 6/2008 |
| WO | WO2008152838 | 12/2008 |
| WO | 2010011971 A1 | 1/2010 |
| WO | 2010035155 A2 | 4/2010 |
| WO | 2011008635 A1 | 1/2011 |

OTHER PUBLICATIONS

Chan, Samuel, et al, Design and Implementation of Dimmable Electronic Ballast Based on Integrated Inductor, IEEE Transactions on Power Electronics, vol. 22, No. 1, Jan. 2007, pp. 291-300, Dept. of Electron. Eng., City Univ. of Hong Kong.

Rand, Dustin, et al, Issues, Models and Solutions for Triac Modulated Phase Dimming of LED Lamps, Power Electronics Specialists Conference, 2007. PESC 2007. IEEE, Jun. 17-21, 2007, pp. 1398-1404, Boston, MA, USA.

Gonthier, Laurent, et al, EN55015 Compliant 500W Dimmer with Low-Losses Symmetrical Switches, ST Microelectronics, Power Electronics and Applications, 2005 European Conference, pp. 1-9, Aug. 7, 2006, Dresden.

Green, Peter, A Ballast That Can Be Dimmed from a Domestic (Phase Cut) Dimmer, International Rectifier, IRPLCFL3 rev.b, pp. 1-12, Aug. 15, 2003, El Segundo, California, USA.

Hausman, Don, Real-Time Illumination Stability Systems for Trailing-Edge (Reverse Phase Control) Dimmers, Lutron RTISS, Lutron Electronics Co, Dec. 2004, pp. 1-4, Coopersburg, PA, USA.

Lee, Stephen, et al, A Novel Electrode Power Profiler for Dimmable Ballasts Using DC Link Voltage and Switching Frequency Controls, IEEE Transactions on Power Electronics, vol. 19, No. 3, May 2004, pp. 847-833, City University of Hong Kong.

Engdahl, Tomi, Light Dimmer Circuits, 1997-2000, www.epanorama.net.

O'Rourke, Conan, et al, Dimming Electronic Ballasts, National Lighting Product Information Program, Specifier Reports, vol. 7, No. 3, Oct. 1999, pp. 1-24, Troy, NY, USA.

SUPERTEX Inc, 56W Off-line LED Driver, 120VAC with PFC, 160V, 350mA Load, Dimmer Switch Compatible, DN--H05, pp. 1-20, Jun. 17, 2008, Sunnyvale, California, USA.

Why Different Dimming Ranges, http://www.lutron.com/TechnicalDocumentLibrary/LutronBallastpg3.pdf.

Wu, Tsai-Fu, et al, Single-Stage Electronic Ballast with Dimming Feature and Unity Power Factor, IEEE Transactions on Power Electronics, vol. 13, No. 3, May 1998, pp. 586-597.

Texas Instruments, Interleaving Continuous Conduction Mode PFC Controller, UCC28070, SLUS794C, Nov. 2007, revised Jun. 2009, Texas Instruments, Dallas TX.

Mamano, Bob, "Current Sensing Solutions for Power Supply Designers", Unitrode Seminar Notes SEM1200, 1999.

http://toolbarpdf.com/docs/functions-and-features-of-inverters.html printed on Jan. 20, 2011.

* cited by examiner

DIMMER DETECTION

CROSS-REFERENCE TO RELATED APPLICATION

This application claims the benefit under 35 U.S.C. §119 (e) and 37 C.F.R. §1.78 of U.S. Provisional Application No. 61/413,164, filed Nov. 12, 2010, and entitled "Digital Dimmer Detection," and U.S. Provisional Application No. 61/369,202, filed Jul. 30, 2010, both of which are incorporated by reference in their entireties.

BACKGROUND OF THE INVENTION

1. Field of the Invention

The present invention relates in general to the field of electronics, and more specifically to a method and system for dimmer detection.

2. Description of the Related Art

Electronic systems utilize dimmers to modify output power delivered to a load. For example, in a lighting system, dimmers provide an input signal to a lighting system, and the load includes one or more light sources such as one or more light emitting diodes (LEDs) or one or more fluorescent light sources. Dimmers can also be used to modify power delivered to other types of loads, such as one or more motors or one or more portable power sources. The input signal represents a dimming level that causes the lighting system to adjust power delivered to a lamp, and, thus, depending on the dimming level, increase or decrease the brightness of the lamp. Many different types of dimmers exist. In general, dimmers use a digital or analog coded dimming signal that indicates a desired dimming level. For example, some analog based dimmers utilize a triode for alternating current ("triac") device to modulate a phase angle of each cycle of an alternating current ("AC") supply voltage. "Modulating the phase angle" of the supply voltage is also commonly referred to as "chopping" or "phase cutting" the supply voltage. Phase cutting the supply voltage causes the voltage supplied to a lighting system to rapidly turn "ON" and "OFF" thereby controlling the average power delivered to the lighting system. As subsequently explained in more detail, both leading edge and trailing edge dimmers are used to modulate the supply voltage waveform and, thus, modulating the delivered power or root mean square ("RMS") voltage delivered to a circuit, such as a switching power converter.

FIG. 1 depicts a lighting system 100 that includes a leading edge dimmer 102. FIG. 2 depicts exemplary voltage graphs 200 associated with the lighting system 100. Referring to FIGS. 1 and 2, the lighting system 100 receives an AC supply voltage $V_{SUPPLY}$ from voltage supply 104. The supply voltage $V_{SUPPLY}$, indicated by voltage waveform 202, is, for example, a nominally 60 Hz/110 V line voltage in the United States of America or a nominally 50 Hz/220 V line voltage in Europe. A leading edge dimmer phase cuts leading edges, such as leading edges 204 and 206, of each half cycle of supply voltage $V_{SUPPLY}$. Since each half cycle of supply voltage $V_{SUPPLY}$ is 180 degrees of the supply voltage $V_{SUPPLY}$, a leading edge dimmer phase cuts the supply voltage $V_{SUPPLY}$ at an angle greater than 0 degrees and less than 180 degrees. Generally, the voltage phase cutting range of a leading edge dimmer 102 is 10 degrees to 170 degrees. The leading edge dimmer 102 can be any type of leading edge dimmer such as a triac-based leading edge dimmer available from Lutron Electronics, Inc. of Coopersberg, Pa. ("Lutron"). A triac-based leading edge dimmer is described in the Background section of U.S. patent application Ser. No. 12/858,164, entitled Dimmer Output Emulation, filed on Aug. 17, 2010, and inventor John L. Melanson.

Ideally, by modulating the phase angle of the dimmer output voltage $V_{\phi\_DIM}$, the leading edge dimmer 102 effectively turns the lamp 106 OFF during time period $T_{OFF}$ and ON during time period $T_{ON}$ for each half cycle of the supply voltage $V_{SUPPLY}$. Thus, ideally, the dimmer 102 effectively controls the average power supplied to the lamp 106 in accordance with the dimmer output voltage $V_{\phi\_DIM}$. However, in many circumstances, the leading edge dimmer 102 does not operate ideally. For example, when the lamp 106 draws a small amount of current $i_{DIM}$, the current $i_{DIM}$ can prematurely drop below a holding current value HC before the supply voltage $V_{SUPPLY}$ reaches approximately zero volts. When the current $i_{DIM}$ prematurely drops below the holding current value HC, a triac-based leading edge dimmer 102 prematurely disengages (i.e. turns OFF and stops conducting), and the dimmer voltage $V_{\phi\_DIM}$ will prematurely drop to zero. When the dimmer voltage $V_{\phi\_DIM}$ prematurely drops to zero, the dimmer voltage $V_{\phi\_DIM}$ does not reflect the intended dimming value as set by the resistance value of variable resistor 114. Additionally, the triac 106 of leading edge dimmer 102 can reengage (conductive) and disengage (non-conductive) repeatedly during a half-cycle of supply voltage $V_{SUPPLY}$ when the current $i_{DIM}$ is below of near the holding current value HC.

FIG. 3 depicts a lighting system 300 that includes a trailing edge dimmer 302. FIG. 4 depicts exemplary voltage graph 400 associated with the lighting system 300. Trailing edge dimmer 102 generates trailing edges, such as trailing edges 404 and 406, of each half cycle of supply voltage $V_{SUPPLY}$ to effectively turn the lamp 106 OFF during time period $T_{OFF}$ and ON during time period $T_{ON}$ for each half cycle of the supply voltage $V_{SUPPLY}$. Trailing edge dimmer 302 also chops the supply voltage $V_{SUPPLY}$ at an angle less than 180 degrees and greater than 0 degrees. The phase cut range of a trailing edge dimmer 102 is, for example, 170 degrees to 10 degrees, and is generally between 150 degrees and 10 degrees. The trailing edge dimmer 102 can be any type of trailing edge dimmer such as field effect transistor based dimmer available from Lutron.

Thus, leading edge, trailing edge, and leading and trailing edge type dimmers are useful to reduce an average amount of power delivered to a load. However, at least in general, dimmers do not directly communicate their dimmer type to other circuits that could benefit from knowing the dimmer type.

SUMMARY OF THE INVENTION

In one embodiment of the present invention, a method includes receiving an input signal representing a supply voltage signal. The method further includes detecting a dimmer affecting the supply voltage signal and generating a dimmer detection signal representing detection of the dimmer.

In another embodiment of the present invention, an apparatus includes a dimmer detection system to receive an input signal representing a supply voltage signal, detect a dimmer affecting the supply voltage signal, and generate a dimmer detection signal representing detection of the dimmer.

In a further embodiment of the present invention, an apparatus includes a power converter system to convert a supply voltage signal into an output voltage. The apparatus further includes a controller, coupled to the power converter system to control the power converter system, wherein the controller includes a dimmer detection system. The dimmer detection system includes one or more input terminals to receive an input signal representing a supply voltage signal and a dimmer detector to detect if a dimmer is affecting the supply voltage signal and generate a dimmer detection signal representing detection of the dimmer. The dimmer detection system further includes a dimmer type detector to determine a type of the dimmer affecting the supply voltage and generate a dimmer type detection signal.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
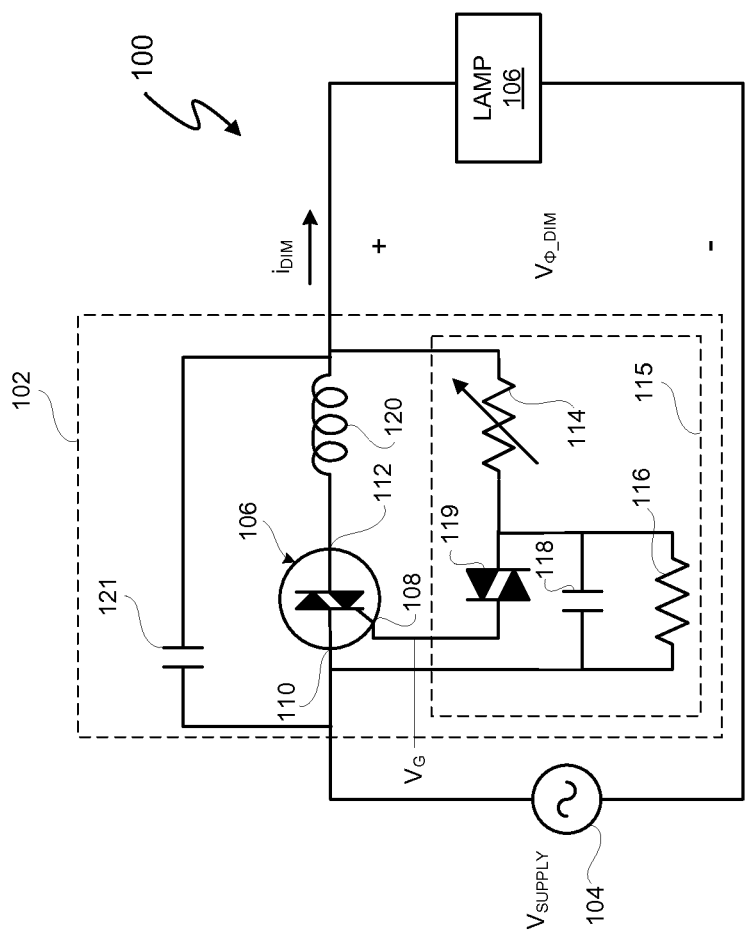
FIG. 1 (labeled prior art) depicts a lighting system that includes a leading edge dimmer.
Figure 2:
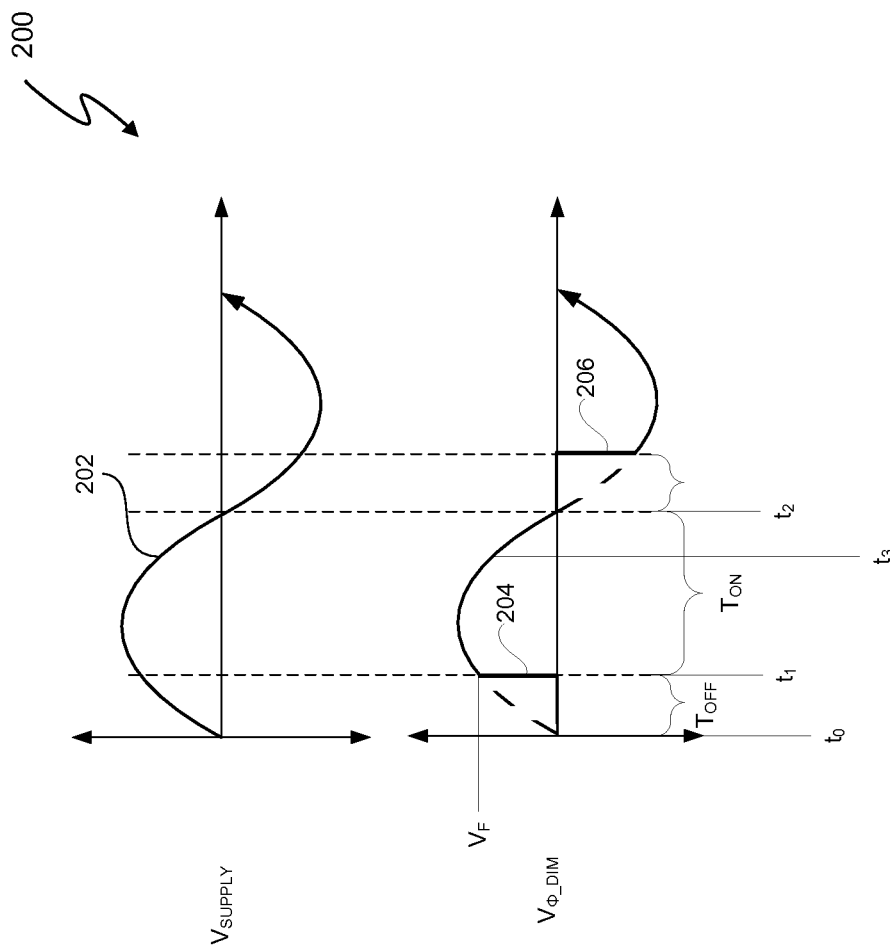
FIG. 2 (labeled prior art) depicts exemplary voltage graphs associated with the lighting system of FIG. 1.
Figure 3:
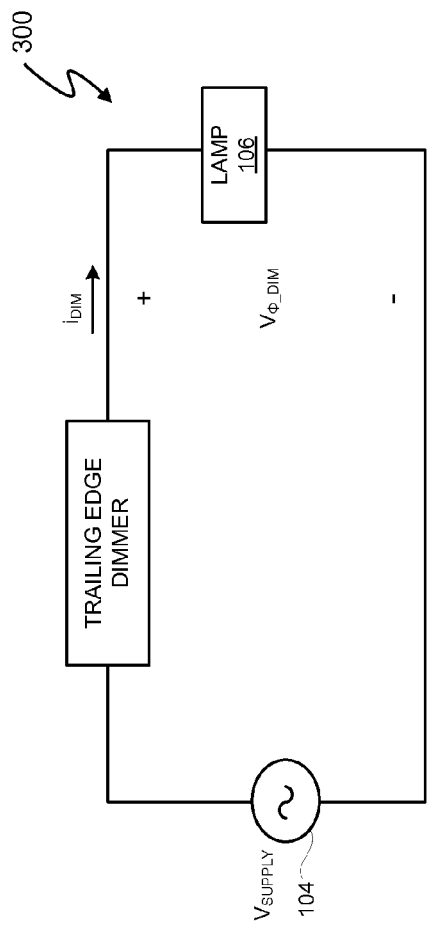
FIG. 3 (labeled prior art) depicts a lighting system that includes a trailing edge dimmer.
Figure 4:
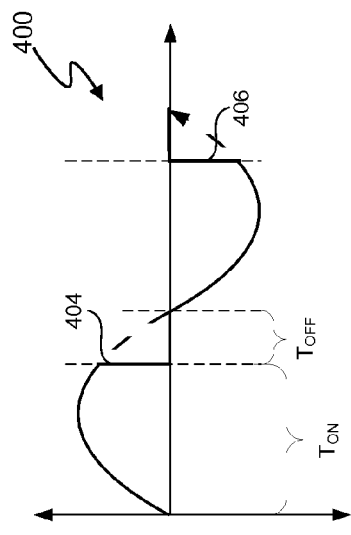
FIG. 4 (labeled prior art) depicts exemplary voltage graphs associated with the lighting system of FIG. 3.

Typically, dimmers do not directly provide data to any device indicating their dimmer type. For example, a leading edge dimmer does not directly provide data indicating that the dimmer is a leading edge dimmer, a trailing edge dimmer does not directly provide data indicating the dimmer is a trailing edge dimmer, and so on. However, it has been determined that, in at least one embodiment, knowing a type of the dimmer assists other circuits in operating more efficiently. It has been determined that, in at least one embodiment, knowing a type of the dimmer assists other circuits in operating more effectively. For example, if a controller in a lighting system knows the type of a dimmer, the controller can keep a dimmer connected and reduce or eliminate flicker of a light source.

In at least one embodiment, a lighting system receives an input signal, such as a supply voltage, that can be affected by a dimmer. The supply voltage can be affected by a dimmer when, for example, a dimmer phase cut (i.e. chopped) the supply voltage. A dimmer detection system of the lighting system determines if a dimmer is affecting the supply voltage. In at least one embodiment, the lighting system asserts a signal, such as a holding or "glue" signal, when the supply voltage to the lighting system drops below a predetermined threshold value to prevent multiple engagement and disengagement cycles of a triac-based dimmer during a single half cycle of the supply voltage. In at least one embodiment, the "glue" signal is a current supplied by, for example, a dimmer emulator circuit, that is sufficient to prevent a dimmer, such as a triac-based dimmer, from misfiring during a dimmer phase cut of the supply voltage. In at least one embodiment, the threshold value is set close to zero (0) volts, so that assertion of the glue signal for at least a minimum threshold amount of time indicates that the supply voltage has been phase cut. In at least one embodiment, the dimmer detection system determines that a dimmer is affecting the supply voltage if the glue signal has been asserted for the minimum threshold amount of time.

In at least one embodiment, the dimmer detection system also determines a type of the dimmer, such as detecting if the dimmer is a leading edge or trailing edge dimmer. The dimmer detection system monitors a supply voltage either directly or via a signal representing the supply voltage. In at least one embodiment, the dimmer detection system determines if a slope of the supply voltage exceeds a minimum threshold value. The minimum threshold value can be, for example, either a minimum positive value or a minimum negative value. The minimum threshold value can be set to indicate an abrupt change in the supply voltage. An abrupt change in the supply voltage indicates the presence of an edge in a phase cut supply voltage. A slope of the supply voltage exceeding a minimum, positive threshold value indicates a leading edge dimmer, and a slope of the supply voltage exceeding a minimum, negative threshold value indicates a trailing edge dimmer. In at least one embodiment, the dimmer detection system determines the slope of the supply voltage by determining an amount of time elapsed between when the supply voltage exceeds two voltage thresholds. If the elapsed time is less than a minimum threshold amount of time, the slope of the supply voltage indicates a phase cut. In at least one embodiment, the dimmer detection system determines the slope of the supply voltage by determining an amount of supply voltage change during a fixed amount of time. The fixed amount of time is set sufficiently low to allow the dimmer detection system to detect a change in the supply voltage uniquely associated with an abrupt change, such as a phase cut, in the supply voltage.

The dimmer detection system can be configured so that if a dimmer is detected and a leading edge dimmer is not detected, then the dimmer detection system determines by default that the dimmer is a trailing edge dimmer. Likewise, the dimmer detection system can be configured so that if a dimmer is detected and a trailing edge dimmer is not detected, then the dimmer detection system determines by default that the dimmer is a leading edge dimmer.

In at least one embodiment, abrupt changes in the supply voltage can occur for reasons other than phase cutting by a dimmer, such as transient excursions of the supply voltage from a nominal supply voltage value. However, transients in the supply voltage are generally anomalies. Thus, transients are generally non-periodic and non-recurring within a time period encompassing a relatively short number of voltage supply cycles, such as eight or less cycles. Thus, to accurately detect a dimmer in an environment that includes a possibility of voltage transients, in at least one embodiment, the dimmer detection system validates a determination of the dimmer type by validating a consistent dimmer type determination over multiple cycles of the supply voltage. Thus, the dimmer detection system can determine both leading edge and trailing edge dimmers and validate the accuracy of the dimmer type determination even in the presence of non-periodic transients.

In at least one embodiment, the dimmer detection system provides dimmer type data to one or more other circuits such as a switching power converter controller. The one or more other circuits utilize the dimmer type data to affect their operation. For example, in at least one embodiment, a controller controls the switching power converter. If the controller assumes that a leading edge dimmer is a triac-based dimmer, then the controller asserts the previously discussed glue signal each time the supply voltage drops below a minimum threshold value. However, if the dimmer detection system determines that the dimmer is a trailing edge dimmer, then, in at least one embodiment, the controller assumes that the dimmer is not triac-based, and, thus, can disable the glue signal and save energy. In at least one embodiment, the controller also asserts the glue signal upon detection of trailing edge dimmer each time the supply voltage drops below a minimum threshold value. Additionally, if the dimmer detection system determines that no dimmer is affecting the supply voltage, then the controller can also disable the glue signal and save energy.

Figure 5:
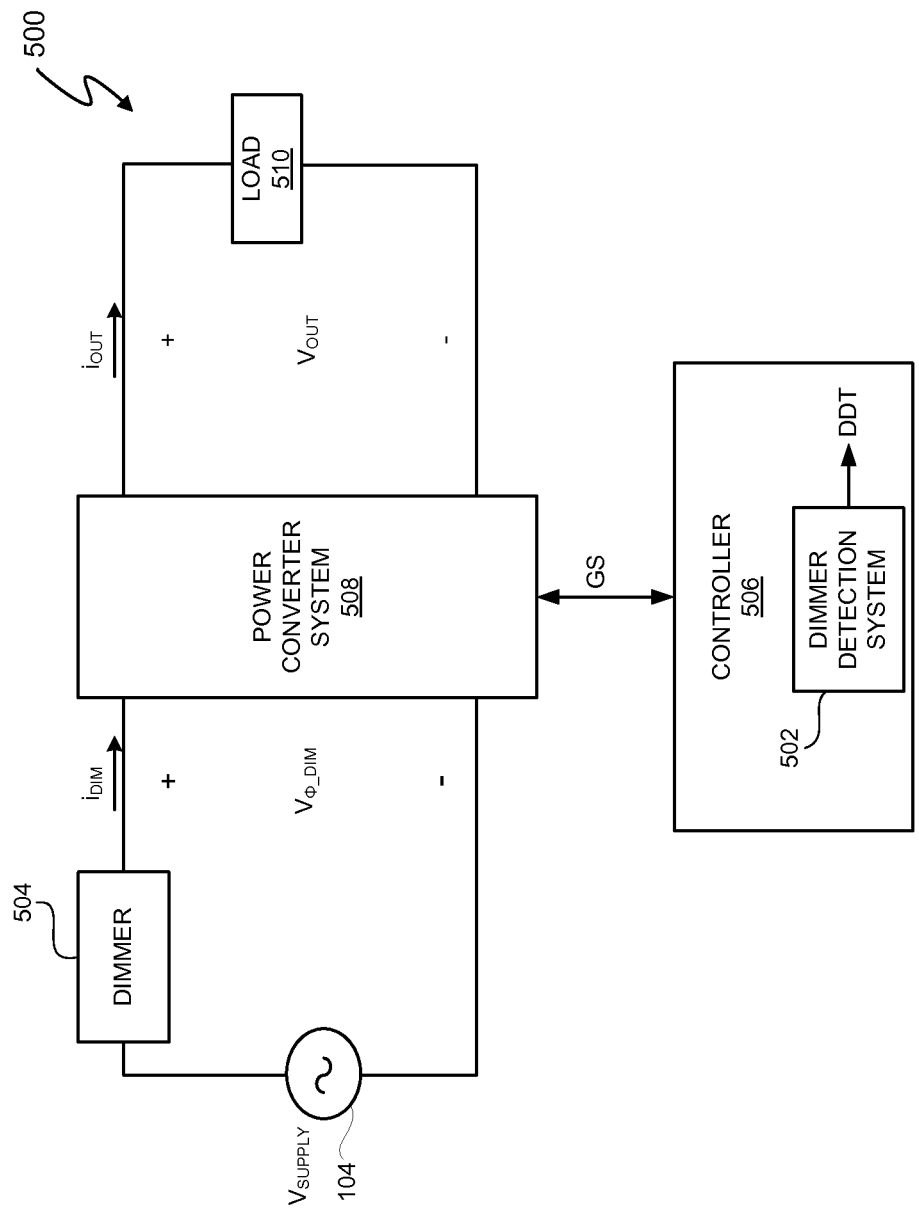
FIG. 5 depicts a lighting system that includes a dimmer detection system.

FIG. 5 depicts a lighting system 500 that includes a dimmer detection system 502 that, as subsequently explained in more detail, detects dimmer 504 when dimmer 504 is affecting the supply voltage $V_{SUPPLY}$. In at least one embodiment, the dimmer detection system 502 also detects the type of dimmer 504. The lighting system 500 also includes a controller 506 to control power conversion by the power converter system 508. In at least one embodiment, power converter system 508 includes a buck-type, boost-type, buck-boost, or Cúk-type switching power converter. Dimmer 504 phase cuts the supply voltage $V_{SUPPLY}$ provided by voltage supply 104. "$V_{\phi\_DIM}$" and "$i_{DIM}$" respectively represent the output voltage and current of dimmer 504. In at least one embodiment, the dimmer detection system 502 monitors the current $i_{DIM}$ and/or voltage $V_{\phi\_DIM}$ and determines either the slope of current $i_{DIM}$ or the slope of voltage $V_{\phi\_DIM}$. Since a phase cut of supply voltage $V_{SUPPLY}$ indicates an abrupt change in the differential of the current $i_{DIM}$ and voltage $V_{\phi\_DIM}$ over time, the slope at the leading edge of the voltage $V_{SUPPLY}$ at the phase cut indicates a leading edge dimmer type dimmer 504, and a slope at the trailing edge of the voltage $V_{SUPPLY}$ at the phase cut indicates a trailing edge dimmer. In at least one embodiment, the dimmer detection system 502 assumes that dimmer 504 is either a leading edge dimmer or a trailing edge dimmer. Thus, in at least one embodiment, the dimmer detection system 502 can attempt to detect either a leading edge or a trailing edge of the supply voltage $V_{SUPPLY}$ or current $i_{DIM}$ but does not have to positively detect both a leading edge and a trailing edge of supply voltage $V_{SUPPLY}$. If dimmer 504 is present and dimmer detection system 502 attempts to detect a leading edge of supply voltage $V_{SUPPLY}$ but does not identify the leading edge, dimmer detection system 502 assumes by default that dimmer 504 is a trailing edge type dimmer. If dimmer detection system 502 attempts to detect a trailing edge of supply voltage $V_{SUPPLY}$ and does not identify a trailing edge, dimmer detection system 502 assumes by default that dimmer 504 is a leading edge type dimmer. In at least one embodiment, dimmer detection system 502 attempts to positively identify both a leading edge and trailing edge of the voltage supply $V_{SUPPLY}$ and/or the current $i_{DIM}$ to identify a dimmer type that phase cuts both a leading and a trailing edge of voltage supply $V_{SUPPLY}$. In at least some embodiments and as subsequently explained in more detail, the dimmer detection system 502 determines the slope either over a fixed period of time or over a fixed voltage range or current change during a fixed period of time.

In at least one embodiment, the dimmer detection system 502 receives the supply voltage $V_{SUPPLY}$ and/or the current $i_{DIM}$ and, thus, monitors the supply voltage $V_{SUPPLY}$ and/or current $i_{DIM}$ directly. In at least one embodiment, the dimmer detection system 502 receives a representation of the supply voltage $V_{SUPPLY}$ and/or the current $i_{DIM}$, such as a scaled version, and, thus, monitors the supply voltage $V_{SUPPLY}$ and/or current $i_{DIM}$ indirectly.

Referring to controller 506, the particular type and design of controller 506 is a matter of design choice. An exemplary controller 506 is available from Cirrus Logic, Inc. having offices in Austin, Tex., USA. An exemplary controller and dimmer emulator combination is described in U.S. patent application Ser. No. 12/858,164, entitled and referred to herein as Dimmer Output Emulation, filed on Aug. 17, 2010, and inventor John L. Melanson, which is incorporated herein by reference.

In at least one embodiment, dimmer detection system 502 is a separate component from controller 506. In at least one embodiment, dimmer detection system 502 is a module of controller 506. Implementation of the dimmer detection system 502 is a matter of design choice. The dimmer detection system 502 can be implemented, for example, as an integrated circuit, analog and/or digital discrete components, and/or in a configurable circuit, such as a field programmable gate array device. Additionally, functionality of the dimmer detection system 502 can be implemented using software or firmware code that is executable by a processor of dimmer detection system 502 or controller 506.

Referring to power converter system 508, the particular type and design of power converter system 508 is a matter of design choice. In at least one embodiment, power converter 514 is a switching power converter, such as a boost-type, buck-type, boost-buck-type, or Cúk-type switching power converter. In at least one embodiment, power converter system 508 provides power factor correction and regulates the output voltage $V_{OUT}$ and/or current delivered to load 510. U.S. Pat. No. 7,719,246, entitled "Power Control System Using a Nonlinear Delta-Sigma Modulator with Nonlinear Power Conversion Process Modeling", filed Dec. 31, 2007, inventor John L. Melanson describes exemplary power converters and controllers. The power converter system 508 delivers power to load 510 through output voltage $V_{OUT}$ and output current $i_{OUT}$. Load 510 can be any type of load, such as any type of light source such as one or more light emitting diodes (LEDs) or one or more fluorescent light sources, one or more motors, one or more portable power sources, or other type of load.

In at least one embodiment, the dimmer detection system 502 provides dimmer detection type data DDT to controller 506, and controller 506 utilizes the dimmer type data to affect the operation of controller 506. For example, in at least one embodiment, if the controller 506 assumes that a leading edge type dimmer 504 is triac-based, then the controller 504 asserts signal GS each time the supply voltage $V_{SUPPLY}$ drops below a minimum threshold value. However, in at least one embodiment, if the dimmer detection system 502 determines that the dimmer 504 is a trailing edge type, then the controller 506 assumes that the dimmer 504 is not triac-based, and, thus, can disable the signal GS and save energy. In at least one embodiment, if the dimmer detection system 502 determines that the dimmer 504 is a trailing edge type, then the controller 506 continues to assert the signal GS to maintain consistent operation of the dimmer 504. Additionally, if the dimmer detection system 502 determines that no dimmer is affecting the supply voltage, then the controller 506 can also disable the signal GS and save energy. In at least one embodiment, the signal GS is a glue signal that prevents a triac (not shown) of a triac-based type dimmer 504 from repeatedly engaging and disengaging during a single half cycle of supply voltage $V_{SUPPLY}$. An exemplary discussion of the glue signal and generation of a glue signal is described below with reference to FIG. 6 and in Dimmer Output Emulation.

Figure 6:
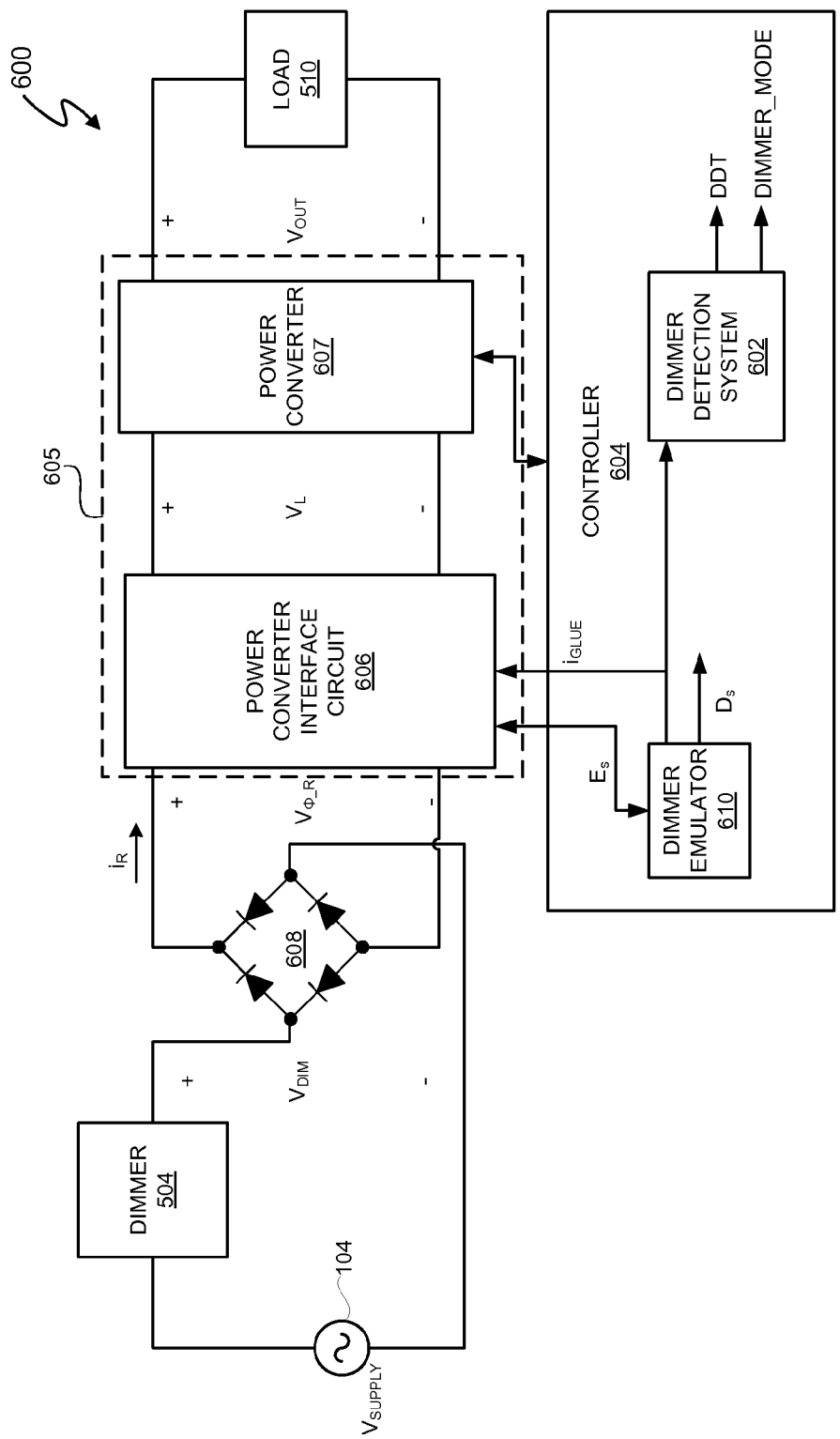
FIG. 6 depicts one embodiment of the lighting system of FIG. 5.

FIG. 6 depicts a lighting system 600 that is one embodiment of lighting system 500. Lighting system 600 includes dimmer detection system 602 to detect a type of dimmer 504. Dimmer detection system 602 represents one embodiment of dimmer detection system 502. Controller 604 represents one embodiment of controller 506. In at least one embodiment, the controller 604 includes a dimmer emulator as described in Dimmer Output Emulation that generates the glue signal $i_{GLUE}$. "$i_{GLUE}$" is one embodiment of the glue signal GS. The glue signal $i_{GLUE}$ draws a glue current from power converter interface circuit 606 during a phase cut by dimmer 504. In at least one embodiment, the "glue" current is a current supplied by, for example, a dimmer emulator circuit, that is sufficient to prevent a dimmer, such as a triac-based dimmer, from misfiring during a dimmer phase cut of the supply voltage. Power converter system 605 represents one embodiment of power converter system 508. Power converter system 605 includes power converter interface circuit 606 and power converter 607. In at least one embodiment, power converter 607 is a buck-type, boost-type, buck-boost, or Cúk-type switching power converter.

Figure 7:
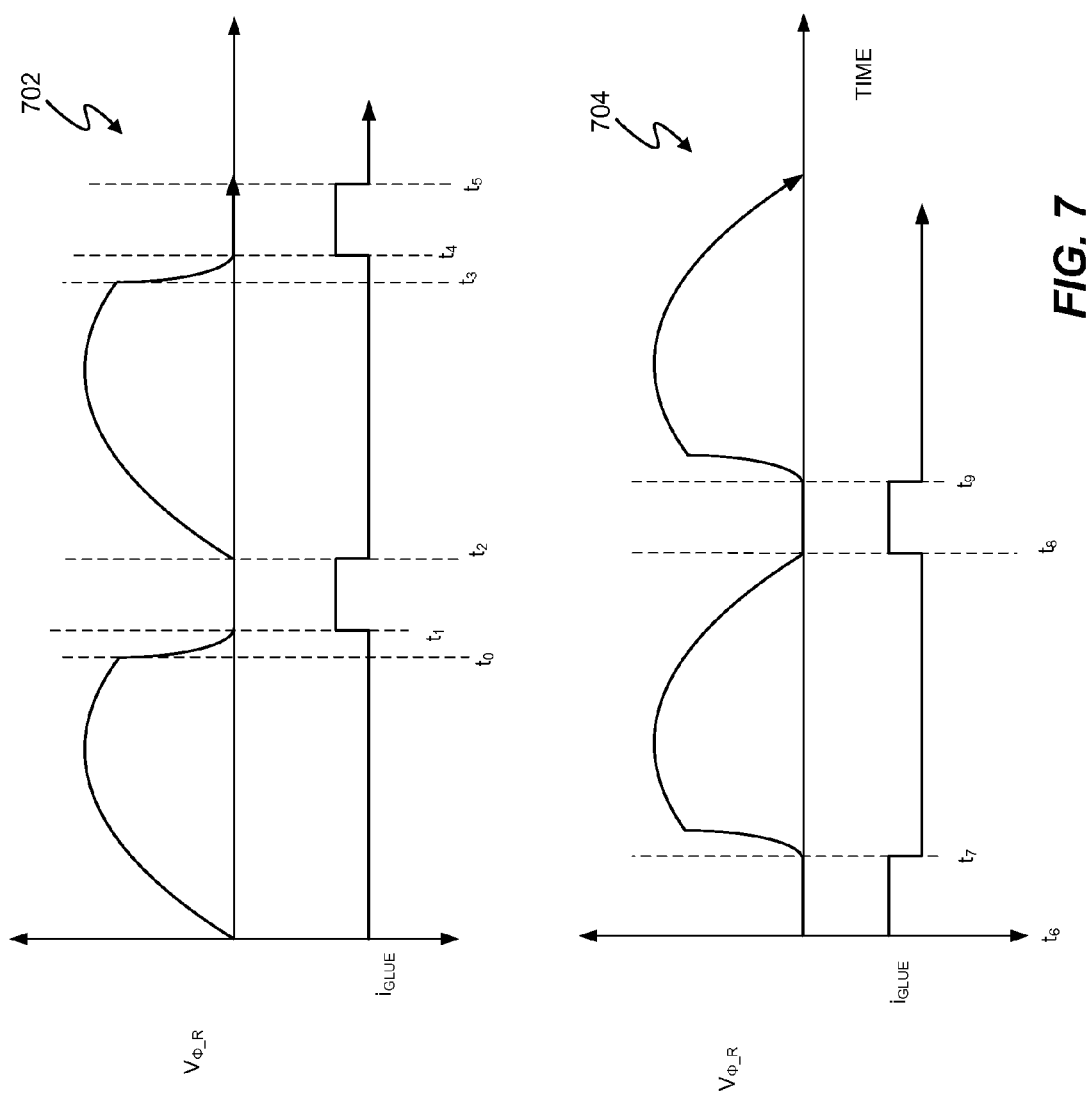
FIG. 7 depicts two exemplary waveforms of a supply voltage for the lighting system of FIG. 6.

FIG. 7 depicts two exemplary waveforms of supply voltage $V_{SUPPLY}$. Referring to FIGS. 6 and 7, full-bridge, diode rectifier 608 rectifies the output voltage $V_{DIM}$ of dimmer 504 to provide a rectified supply voltage $V_{\phi\_R}$ to power converter interface circuit 606. Dimmer Output Emulation describes an exemplary power converter interface circuit. The rectified supply voltage $V_{\phi\_R}$ waveform 702 represents an exemplary trailing edge, phase cut, rectified supply $V_{\phi\_R}$. In waveform 702, the rectified supply voltage $V_{\phi\_R}$ is phase cut at time $t_0$ and time $t_3$ to generate a trailing edge phase cut. The rectified supply voltage $V_{\phi\_R}$ waveform 704 represents an exemplary leading edge, phase cut, rectified supply $V_{\phi\_R}$. In waveform 704, the rectified supply voltage $V_{\phi\_R}$ is phase cut at time $t_7$ and time $t_9$ to generate a leading edge phase cut. Controller 604 includes a dimmer emulator 610. The dimmer emulator 610 is described in Dimmer Output Emulation. Although dimmer emulator 610 is depicted as part of controller 604, dimmer emulator 610 can also, for example, be implemented as a component separate from controller 604.

During the phase cut of the rectified supply voltage $V_{\phi\_R}$ in waveform 702, dimmer emulator 604 generates glue signal $i_{GLUE}$ during respective times $t_1$ to $t_2$ and $t_4$ to $t_5$. During the phase cut of the rectified supply voltage $V_{\phi\_R}$ in waveform 704, dimmer emulator 604 generates glue signal $i_{GLUE}$ during respective times $t_6$ to $t_7$ and $t_8$ to $t_9$. The glue signal $i_{GLUE}$ is asserted, as, for example, described in Dimmer Output Emulation, once the rectified supply voltage $V_{\phi\_R}$ drops below a predetermined threshold value, such as approximately zero (0) volts. The dimmer emulator 610 generates the glue signal $i_{GLUE}$ during a phase cut to hold the rectified supply voltage $V_{\phi\_R}$ low to prevent a triac-based dimmer from misfiring. Thus, generation of the glue signal $i_{GLUE}$ for a minimum threshold of time indicates the presence of a dimmer affecting the supply voltage $V_{SUPPLY}$. However, although it is clear from the depiction of waveforms 702 and 704 which waveform has a trailing edge phase cut and which waveform has a leading edge phase cut, in at least one embodiment, the glue signal $i_{GLUE}$ itself does not provide enough information to controller 604 for controller 604 to identify the type of dimmer 504.

Dimmer detection system 602 monitors the glue signal $i_{GLUE}$. In at least one embodiment, if the glue signal is asserted, such as between times $t_1$ and $t_2$, the dimmer detection system 602 determines that a dimmer is affecting the supply voltage $V_{SUPPLY}$. Once the dimmer detection system 602 determines that a dimmer is affecting the supply voltage $V_{SUPPLY}$, the dimmer detection system 602 monitors the rectified supply voltage $V_{\phi\_R}$ to detect a type of dimmer 504. In at least one embodiment, the dimmer detection system 602 attempts to determine if dimmer 504 is a trailing edge dimmer. In at least one embodiment, the dimmer detection system 602 determines a slope of the rectified supply voltage $V_{\phi\_R}$. If the slope exceeds a maximum value, an abrupt change in the rectified supply voltage $V_{\phi\_R}$ is indicated, such as the abrupt change in the rectified supply voltage $V_{\phi\_R}$ between times $t_0$ and $t_1$ and between times $t_3$ and $t_4$. In at least one embodiment, the dimmer detection system 602 determines if a slope of the rectified supply voltage $V_{\phi\_R}$ exceeds a minimum threshold value. The minimum threshold value can be, for example, either a minimum positive value or a minimum negative value. A slope of the rectified supply voltage $V_{\phi\_R}$ exceeding a minimum, positive threshold value indicates a leading edge dimmer 504, and a slope of the rectified supply voltage $V_{\phi\_R}$ exceeding a minimum, negative threshold value indicates a trailing edge dimmer 504.

In at least one embodiment, the dimmer detection system 602 determines the slope of the rectified supply voltage $V_{\phi\_R}$ by determining an amount of time elapsed between when the rectified supply voltage $V_{\phi\_R}$ exceeds two voltage thresholds. If the elapsed time is less than a minimum threshold amount of time, the slope of the rectified supply voltage $V_{\phi\_R}$ indicates a phase cut. In at least one embodiment, the dimmer detection system 602 detects the slope of the rectified supply voltage $V_{\phi\_R}$ by determining an amount of voltage change during a fixed amount of time. The fixed amount of time is set sufficiently low to allow the dimmer detection system 602 to detect a change in the supply voltage uniquely associated with an abrupt change, such as a phase cut, in the supply voltage. In at least one embodiment, it is highly improbable that dimmer detection system 602 will detect phase cuts in the rectified supply voltage $V_{\phi\_R}$ over multiple cycles unless dimmer 504 is phase cutting the rectified supply voltage $V_{\phi\_R}$. Thus, to validate a type of dimmer, the dimmer detection system 602 determines the slope of the rectified supply voltage $V_{\phi\_R}$ multiple times within a single cycle and/or within multiple cycles of the rectified supply voltage $V_{\phi\_R}$. If the dimmer detection system 602 consistently detects a phase cut of the rectified supply voltage $V_{\phi\_R}$, then dimmer detection system 602 validates a type of dimmer 504.

The particular time thresholds and voltage thresholds used by dimmer detection system 602 to determine a phase cut in the rectified supply voltage $V_{\phi\_R}$ are a matter of design choice. In at least one embodiment, the minimum voltage thresholds are set to detect an abrupt change after the rectified supply voltage $V_{\phi\_R}$ exceeds a minimum phase cut angle. In at least one embodiment, the time thresholds are set low enough to distinguish between an uncut slope of the rectified supply voltage $V_{\phi\_R}$ and a phase cut slope of the rectified supply voltage $V_{\phi\_R}$. The slope of the rectified supply voltage $V_{\phi\_R}$ is very high at very low phase cut angles and at very high phase cut angles. Thus, as described in more detail below, in at least one embodiment, the dimmer detection system 602 determines a slope of the rectified supply voltage $V_{\phi\_R}$ during a period of time within a minimum and maximum phase angle range.

Dimmer detection system 602 provides data DDT and DIMMER_MODE to controller 604. In at least one embodiment, the DIMMER_MODE output signal is a dimmer detection signal that informs controller 604 of the detection of a dimmer 504, and the dimmer detection type signal DDT informs controller 604 of the type of dimmer 504. In at least one embodiment, controller 604 operates more efficiently when dimmer detection system 602 detects the type of dimmer 504. For example, in at least one embodiment, if the controller 604 assumes that a leading edge type dimmer 504 is triac-based, then the controller 604 asserts the glue signal $i_{GLUE}$ each time the rectified supply voltage $V_{\phi\_R}$ drops below a minimum threshold value. However, if the dimmer detection system 602 determines that the dimmer 504 is a trailing edge type, then the controller 604 assumes that the dimmer 504 is not triac-based, but, in at least one embodiment, continues to assert the glue signal $i_{GLUE}$ between times $t_1$ and $t2$ for trailing edge waveform 702. Additionally, if the dimmer detection system 602 determines that no dimmer is affecting the supply voltage, then the controller 604 can also disable the glue signal and save energy.

Figure 8:
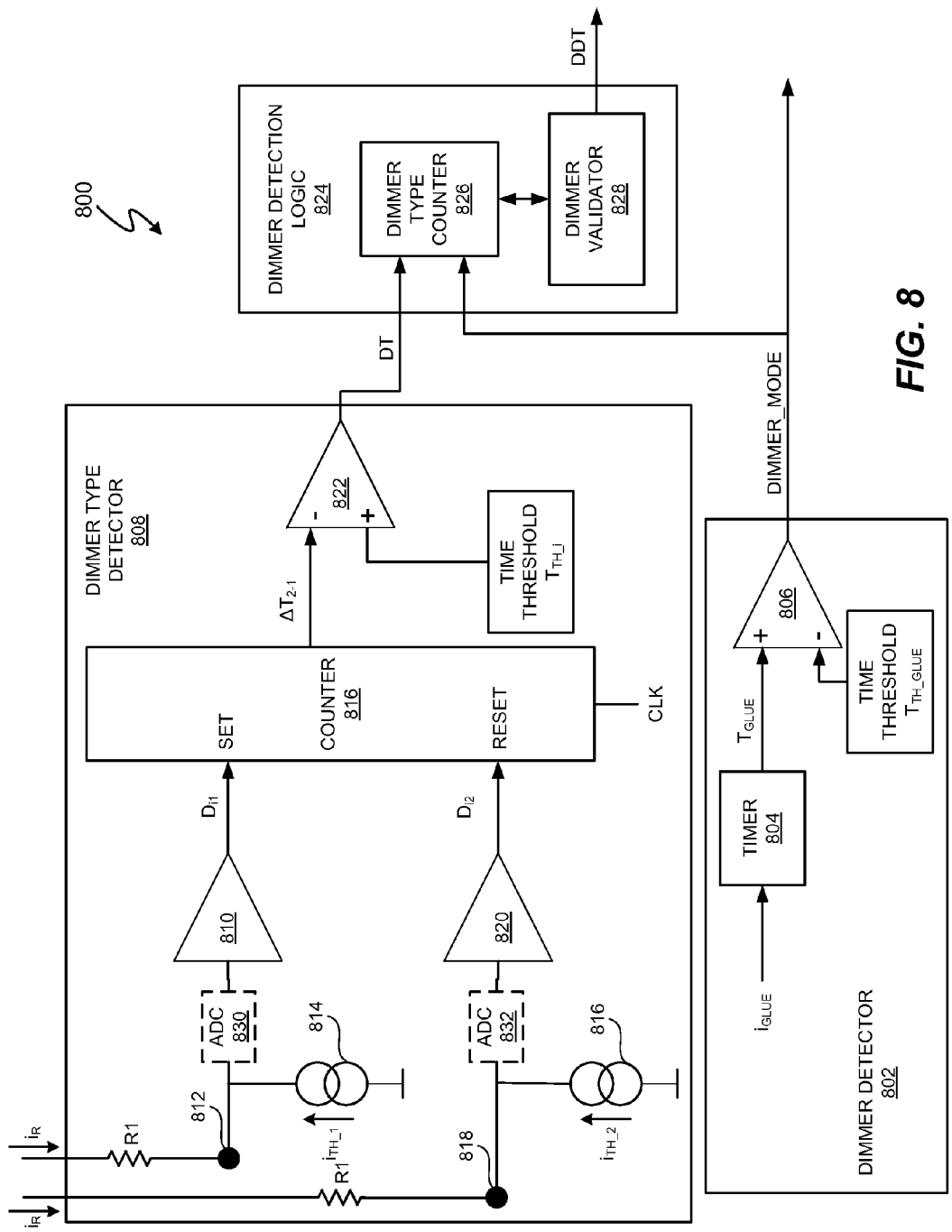
FIG. 8 depicts an embodiment of a dimmer detection system of the lighting system of FIG. 6.
Figure 9:
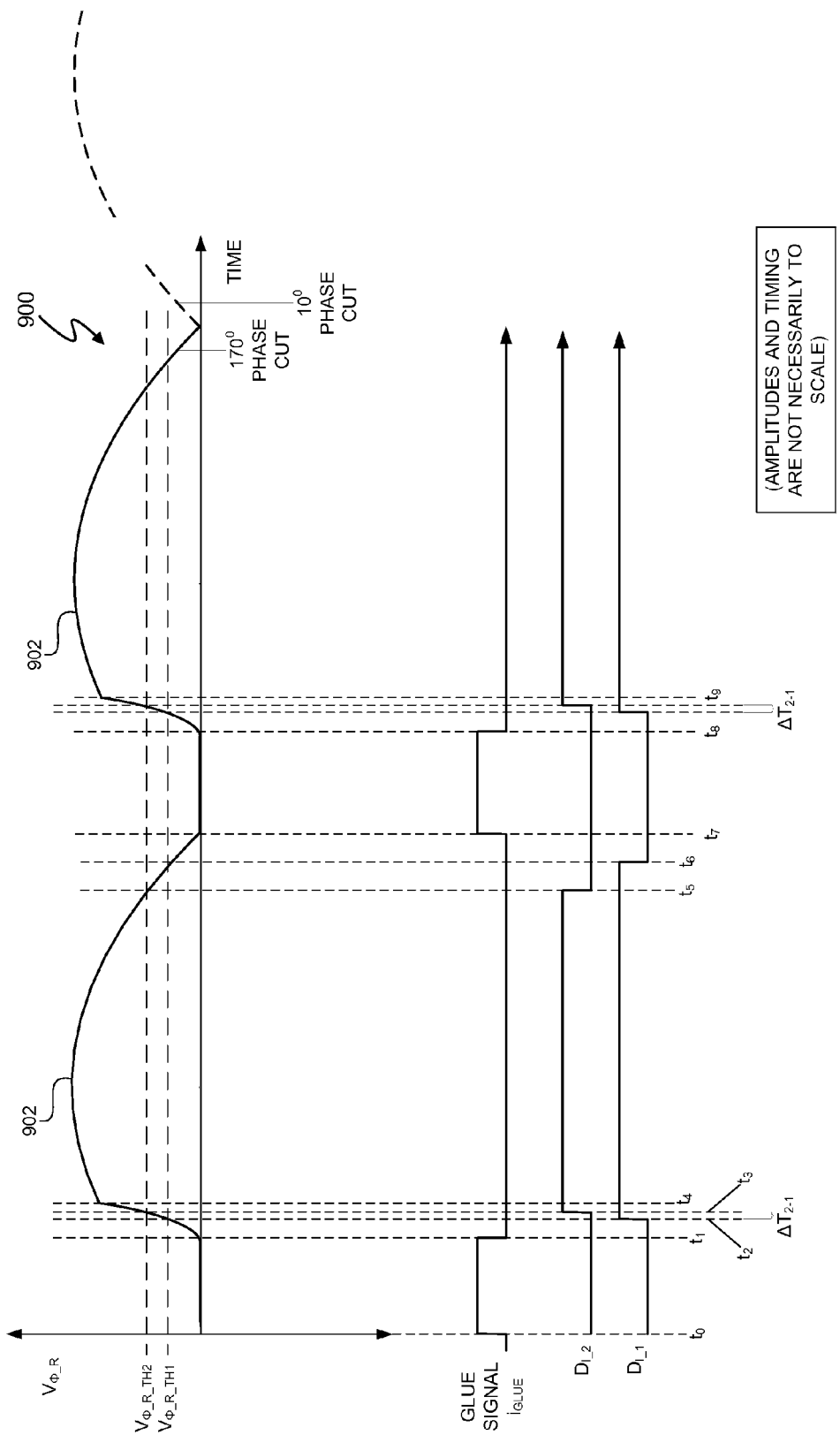
FIG. 9 depicts exemplary leading edge phase cut lighting system signals associated with the dimmer detection system of FIG. 8.
Figure 10:
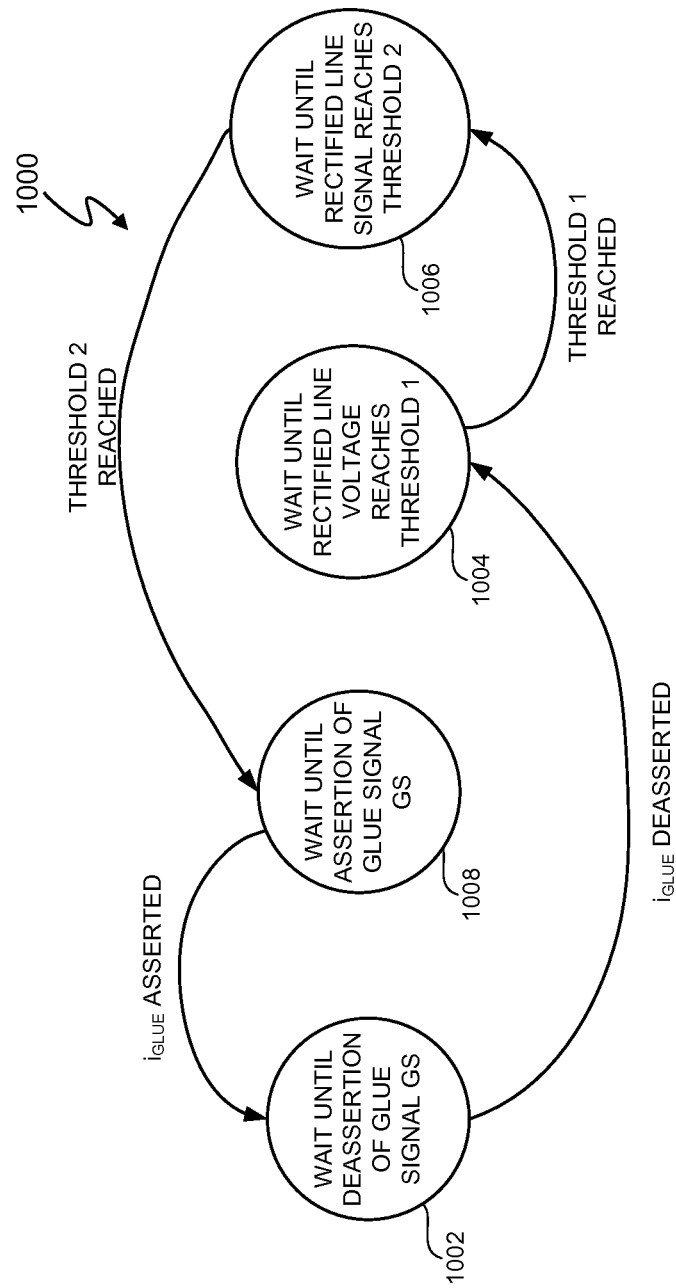
FIG. 10 depicts a state diagram for detecting a 110 V+/−20%, 60 Hz dimmer type by the state machine of the dimmer detection system of FIG. 8.

FIG. 8 depicts a dimmer detection system 800, which represents one embodiment of dimmer detection system 602. FIG. 9 depicts exemplary leading edge phase cut lighting system signals 900 associated with dimmer detection system 800. In at least one embodiment, dimmer detection system 800 operates as a state machine. FIG. 10 depicts a state diagram 1000 for detecting a 110 V+/−20%, 60 Hz dimmer type by the state machine of dimmer detection system 800.

Referring to FIGS. 8, 9, and 10, the dimmer detection system 800 includes a dimmer detector 802. Dimmer detector 802 determines whether a dimmer is phase cutting the rectified supply voltage $V_{\phi\_R}$ by determining if the glue signal $i_{GLUE}$ is asserted for at least a minimum dimmer detection threshold time $T_{TH\_GLUE}$. In at least one embodiment, the dimmer detection system 800 detects a dimmer and determines a dimmer type for phase cut angles between 10 degrees and 170 degrees, which equates to approximately the rectified supply voltage $V_{\phi\_R}$ equal to 28V on the rising and falling portions of the rectified supply voltage $V_{\phi\_R}$. In at least one embodiment, the minimum dimmer detection threshold time $T_{TH\_GLUE}$ is 506 μsec. "506 μsec" is the approximate duration of 10 degrees of a 110 Hz, rectified supply voltage $V_{\phi\_R}$ signal. In at least one embodiment, the value of $T_{TH\_GLUE}$ is a matter of design choice and is, for example, programmable.

As previously described and as shown in FIG. 9, the glue signal $i_{GLUE}$ is asserted (i.e. is a logical one) when the rectified supply voltage $V_{\phi\_R}$ drops below a predetermined voltage threshold $V_{GS\_TH}$, such as approximately 0 V. Timer 804 receives the glue signal $i_{GLUE}$ and generates an output signal $T_{GLUE}$ representing a determination of the duration of the assertion of the glue signal $i_{GLUE}$. Comparator 806 compares the value of output signal $T_{GLUE}$ with the minimum dimmer detection threshold time $T_{TH\_GLUE}$ and generates a dimmer detection output signal DIMMER_MODE. The output signal DIMMER_MODE is a logical 0 if $T_{GLUE}$ is less than $T_{TH\_GLUE}$, which indicates that dimmer 504 is inactive and, thus, has not phase cut the rectified supply voltage $V_{\phi\_R}$. The output signal DIMMER_MODE is a logical 1 if $T_{GLUE}$ is greater than $T_{TH\_GLUE}$, which indicates that dimmer 504 is actively phase cutting the supply voltage $V_{SUPPLY}$ and, thus, has phase cut the rectified supply voltage $V_{\phi\_R}$.

For example, in FIG. 9, dimmer 504 phase cuts the rectified supply voltage $V_{\phi\_R}$ at times $t_0$ and $t_7$ and at an angle between 10° and 170°. The glue signal $i_{GLUE}$ is asserted from time $t_0$ to $t_1$ and again from time $t_7$ to $t_8$ when the rectified supply voltage $V_{\phi\_R}$ is approximately 0 V. The time between times $t_0$ and $t_1$ and between times $t_7$ and $t_8$ is greater than $T_{TH\_GLUE}$, and, thus, the output signal DIMMER_MODE is a logical 1. Thus, the dimmer detector 802 detects an active dimmer 504, i.e. dimmer 504 is actively phase cutting the rectified supply voltage $V_{\phi\_R}$.

Referring to FIGS. 8, 9, and 10, the dimmer detection system 800 also includes a dimmer type detector 808. In at least one embodiment, the dimmer type detector 808 is activated when the dimmer detection output signal DIMMER_MODE is a logical 1, which indicates that dimmer detector 802 has detected an active dimmer 504. Thus, if the dimmer detection output signal DIMMER_MODE is a logical 0, in at least one embodiment, dimmer detection system 800 does not operate dimmer type detector 808, thus, saving power.

During operation, the dimmer type detector 808 determines if a slope of a trailing edge of the rectified supply voltage $V_{\phi\_R}$ exceeds a predetermined threshold value by measuring an amount of time between a predetermined change in the current $i_R$, which corresponds to changes in the rectified supply voltage $V_{\phi\_R}$. If the amount of time is less than a threshold time $T_{TH\_i}$, then the slope of the rectified supply voltage $V_{\phi\_R}$ indicates an abrupt change consistent with a leading edge phase cut of the rectified supply voltage $V_{\phi\_R}$. Upon detection of the leading edge phase cut of the rectified supply voltage $V_{\phi\_R}$, the dimmer type detector 808 generates a dimmer type output signal DT indicating a leading edge type dimmer 504. In at least one embodiment, since dimmer detector 802 has already detected the presence of an active dimmer 504 when dimmer type detector 808 is operating, if the slope of the rectified supply voltage $V_{\phi\_R}$ does not indicate a leading edge phase cut, the dimmer type output signal DT of dimmer type detector 808 indicates that dimmer 504 is a trailing edge type dimmer. Although the embodiment of dimmer type detector 808 in FIG. 8 utilizes current comparators 810 and 820 and first and second threshold currents $i_{TH\_1}$ and $i_{TH\_2}$ as references, well-known voltage comparators can be substituted for one or both of current comparators 810 using one or both of the first and second voltage thresholds of $V_{\phi\_R\_TH1}$ and $V_{\phi\_R\_TH2}$ of FIG. 9, which correspond to the first and second threshold currents $i_{TH\_1}$ and $i_{TH\_2}$. In at least one embodiment, dimmer detection system 800 optionally includes two analog-to-digital converters (ADCs) 830 and 832 that respectively convert $(i_R - i_{TH\_1})$ and $(i_R - i_{TH\_2})$ into digital input signals for respective comparators 810 and 820. When the dimmer detection system 800 includes ADCs 830 and 832, comparators 810 and 820 are implemented using well-known digital circuitry to generate respective digital output signals $D_{i1}$ and $D_{i2}$.

In at least one embodiment, dimmer detection system 800 operates dimmer type detector 808 in accordance with state diagram 1000 when the root mean square (RMS) voltage of the rectified supply voltage $V_{\phi\_R}$ is 110V+/−20%. The state diagram 1000 begins with state 1002. In state 1002, the dimmer detection system 800 waits until the glue signal $i_{GLUE}$ is deasserted. In FIG. 9, the glue signal $i_{GLUE}$ is asserted at time $t_0$ when the rectified supply voltage $V_{\phi\_R}$ is approximately 0V and is deasserted at time $t_1$ when the rectified supply voltage $V_{\phi\_R}$ rises above approximately 0V. Once the glue signal $i_{GLUE}$ is deasserted at time $t_1$, dimmer detection system 800 proceeds to state 1004. In state 1004, the dimmer detection system 800 waits until the rectified supply voltage $V_{\phi\_R}$ reaches the first threshold voltage $V_{\phi\_R\_TH1}$.

At time $t_2$, the rectified supply voltage $V_{\phi\_R}$ reaches the first threshold voltage $V_{\phi\_R\_TH1}$, which corresponds to the first threshold current $i_{TH\_1}$. The dimmer type detector 808 utilizes a current comparator 810 to determine when the rectified supply voltage $V_{\phi\_R}$ reaches first threshold voltage $V_{\phi\_R\_TH1}$. The dimmer type detector 808 monitors current $i_R$ by allowing current $i_R$ to flow through resistor R1 and into node 812. Current source 814 generates a first threshold current $i_{TH\_1}$, and the first threshold current $i_{TH\_1}$ also flows into node 812. If current $i_R$ is less than the first threshold current $i_{TH\_1}$, the output signal $D_{i1}$ of current comparator 810 is a logical 0, which indicates that the rectified supply voltage $V_{\phi\_R}$ is less than the first threshold voltage $V_{\phi\_R\_TH1}$. When current $i_R$ is greater than the first threshold current $i_{TH\_1}$, the output signal $D_{i1}$ of current comparator 810 is a logical 1, which occurs at time $t_2$ and indicates that the rectified supply voltage $V_{\phi\_R}$ is greater than the first threshold voltage $V_{\phi\_R\_TH1}$. The "set" input of counter 816 receives the output signal $D_{i1}$. When the output signal $D_{i1}$ is a logical 1, counter 816 begins counting and increments at the frequency of a clock signal CLK. The frequency of clock signal CLK is set to allow counter 816 to measure an amount of time $\Delta T_{2-1}$ between when current $i_R$ is greater than threshold currents $i_{TH\_1}$ and $i_{TH\_2}$ when the rectified supply voltage $V_{\phi\_R}$ has a leading edge phase cut for phase angles between 10° and 170°. The particular values of a minimum time $\Delta T_{2-1}$ and a frequency $f_{CLK}$ are matters of design choice. In at least one embodiment, the minimum time $\Delta T_{2-1}$ is 27 μsec, and the frequency $f_{CLK}$ of the clock signal CLK is at least $2/\Delta T_{2-1}$, i.e. $f_{CLK} \geq 74.1$ kHz.

After the first threshold voltage $V_{\phi\_R\_TH1}$ is reached, the dimmer detection system 800 then proceeds to state 1006 and waits until the current $i_R$ is greater than the second threshold voltage $V_{\phi\_R\_TH2}$, which corresponds to second threshold current $i_{TH\_2}$. Current source 816 generates a second threshold current $i_{TH\_2}$, and the current $i_R$ and the second threshold current $i_{TH\_2}$ flow into node 818. If current $i_R$ is less than the second threshold current $i_{TH\_2}$, the output signal $D_{i2}$ of current comparator 820 is a logical 0, which indicates that the rectified supply voltage $V_{\phi\_R}$ is less than the second threshold voltage $V_{\phi\_R\_TH2}$. When current $i_R$ is greater than the second threshold current $i_{TH\_2}$, the output signal $D_{i2}$ of current comparator 810 is a logical 1, which occurs at time $t_3$ and indicates that the rectified supply voltage $V_{\phi\_R}$ is greater than the second threshold voltage $V_{\phi\_R\_TH2}$. The "reset" input of counter 816 receives the output signal $D_{i2}$. When the output signal $D_{i2}$ is a logical 1, counter 816 is reset. The output value $\Delta T_{2-1}$ of counter 816 represents the count value of counter 816 when counter 816 is reset. Thus, the counter output value $\Delta T_{2-1}$ equals the elapsed time between times $t_2$ and $t_3$, i.e. $\Delta T_{2-1} = t_3 - t_2$.

Comparator 822 compares the counter output value $\Delta T_{2-1}$ with a predetermined time threshold $T_{TH\_1}$. If the counter output value $\Delta T_{2-1}$ is less than the predetermined time threshold $T_{TH\_1}$, the detector type output DT of comparator 822 is a logical 1, which indicates a leading edge type dimmer 504. If the counter output value $\Delta T_{2-1}$ is greater than the predetermined time threshold $T_{TH\_1}$, the detector type output DT of comparator 822 is a logical 0, which represents a trailing edge type dimmer 504 or no dimmer. Since the quantity $(V_{\phi\_R\_TH1} - V_{\phi\_R\_TH2})/\Delta T_{2-1}$ represents the approximate slope of the rectified supply voltage $V_{\phi\_R}$ between times $t_2$ and $t_3$, in at least one embodiment, the dimmer detection system 800 determines the slope of the rectified supply voltage $V_{\phi\_R}$ when the rectified supply voltage $V_{\phi\_R}$ crosses the first and second voltage thresholds $V_{\phi\_R/R1\_TH1}$ and $V_{\phi\_R/R1\_TH2}$.

The resistance value R1, the current values of the first and second threshold currents $i_{TH\_1}$ and $i_{TH\_2}$, and the value the time threshold $T_{TH\_1}$ are set so that the detector type output DT is a logical 0 in the absence of a leading edge phase cut of the rectified supply voltage $V_{\phi\_R}$, and the detector type output DT is a logical 1 when dimmer 504 is a leading edge dimmer type. In at least one embodiment, the first threshold current $i_{TH\_1}$ is set to correspond to a value of current $i_R$ such that $i_R/R1$ equals 10.3V, the second threshold current $i_{TH\_2}$ is set to correspond to a value of current $i_R$ such that $i_R/R1$ equals 15.0V, and the time threshold $T_{TH\_1}$ is 27 μsec. These values allow detection of a dimmer type having a minimum phase cut angle of 10°, a maximum phase cut angle of 170° for a 110V, 60 Hz supply voltage $V_{SUPPLY}$. The values of current $i_R$, current thresholds $i_{TH\_1}$ and $i_{TH\_2}$, and resistance value R1 are matters of design choice. In at least one embodiment, for a 110 Vrms rectified supply voltage $V_{\phi\_R}$, the resistance value R1 to conduct a maximum current of 100 μA is 1.2 Mohms, the first threshold current $i_{TH\_1}$ occurs at rectified supply voltage $V_{\phi\_R}$ equal 10 V and equals 8 μA, and the second threshold current $i_{TH\_2}$ occurs at rectified supply voltage $V_{\phi\_R}$ equal 20 V and equals 16 μA.

Once the second threshold voltage $V_{\phi\_R\_TH2}$ is reached, dimmer detection system 800 proceeds to state 1008 and waits for the assertion of the glue signal $i_{GLUE}$, which occurs at time $t_7$. The output signals $D_{i1}$ and $D_{i2}$ both return to logical 0 at respective times $t_5$ and $t_6$ when current $i_R$ falls below respective threshold currents $i_{TH\_2}$ and $i_{TH\_1}$.

Figure 11:
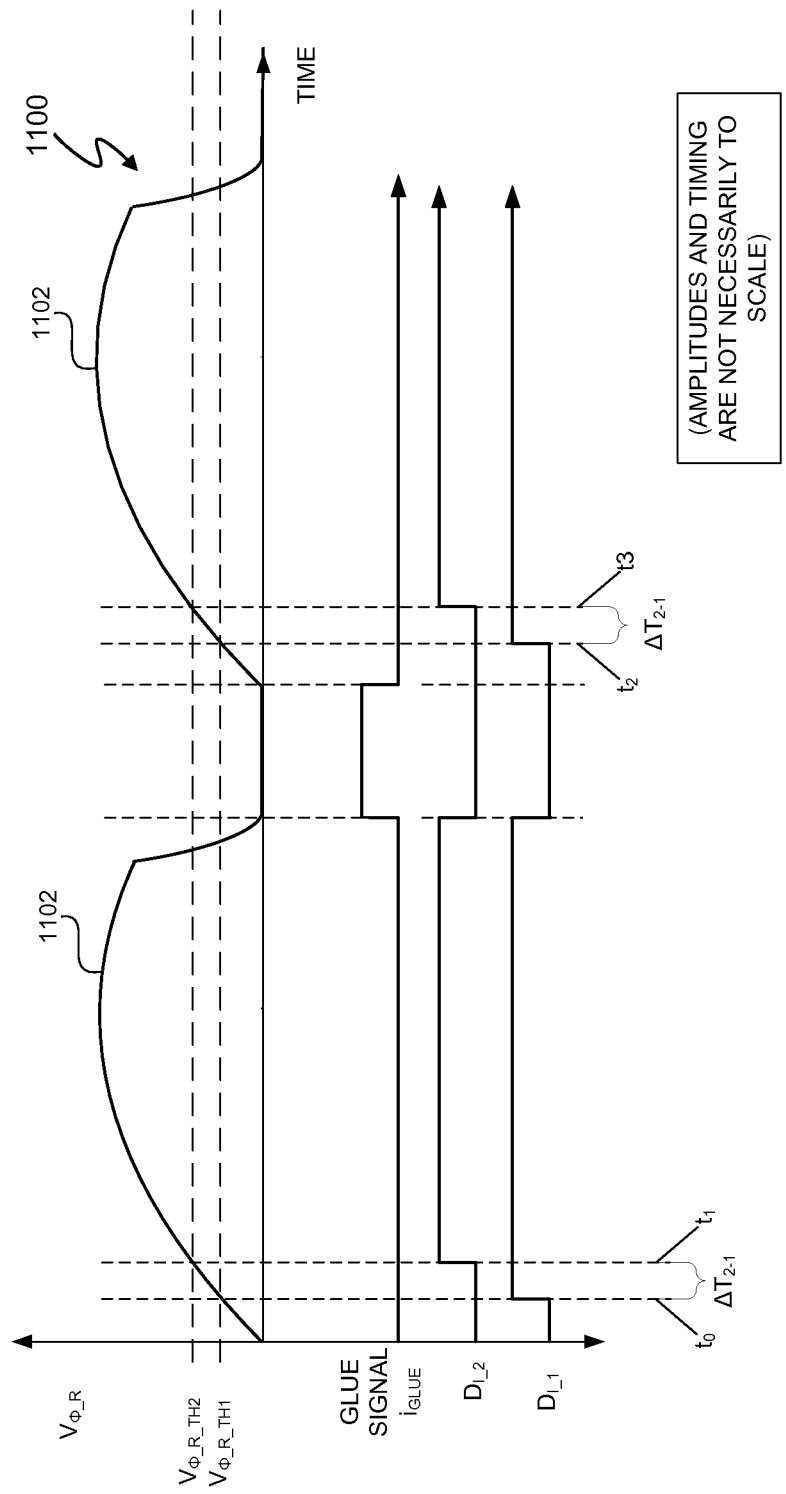
FIG. 11 depicts exemplary trailing edge phase cut lighting system signals associated with the dimmer detection system of FIG. 8.

FIG. 11 depicts exemplary trailing edge phase cut lighting system signals 1100 associated with dimmer detection system 800. Referring to FIGS. 8, 10, and 11, the dimmer detection system 800 operates identically as described with the leading edge phase cut lighting system signals 900. However, for a trailing edge phase cut, the rectified supply voltage $V_{\phi\_R}$ 1102, the times between $t_0$ and $t_1$ and $t_2$ and $t_3$ when the rectified supply voltage $V_{\phi\_R}$ initially crosses respective thresholds $V_{\phi\_R\_TH1}$ and $V_{\phi\_R\_TH2}$, are each greater than the time threshold $T_{TH\_1}$. Accordingly, for the trailing edge phase cut lighting system signals 1100, the detector type output DT of comparator 822 is a logical 0. In at least one embodiment, the same operations occur in dimmer detection system 800 with no phase cut of the rectified supply voltage $V_{\phi\_R}$, and the DIMMER_MODE and DDT signals indicate an absence of a dimmer.

While the glue signal $i_{GLUE}$ is asserted, dimmer detection logic 824 determines the type of dimmer 504 from the logical states of dimmer detection signal DIMMER_MODE and the dimmer type signal DT in accordance with Table 1 ("X" indicates a "do not care state"):

TABLE 1

| DIMMER_MODE | DT | DIMMER TYPE |
|---|---|---|
| 0 | X | NO DIMMER |
| 1 | 1 | LEADING EDGE |
| 1 | 0 | TRAILING EDGE |

In at least one embodiment, if a type of dimmer 504 is not detected, the dimmer detection system 800 and dimmer emulator 610 (FIG. 6) continues to positively identify a dimmer type and does not determine a dimmer type by default. In this embodiment, the controller 604 (FIG. 6) continues to operate as if a dimmer 504 is present until a dimmer type is positively identified.

In at least one embodiment, the dimmer detection logic 824 generates a determined dimmer type output signal DDT to indicate the determined dimmer type from Table 1. In at least one embodiment, transients in the rectified supply voltage $V_{\phi\_R}$ and missed phase cut cycles by dimmer 504 in the rectified supply voltage $V_{\phi\_R}$ can result in an erroneous determination by the dimmer detection system 800 of the type of dimmer 504. Accordingly, in at least one other embodiment, the dimmer detection logic 824 validates that the determined dimmer type is accurate by counting a number of times that a particular dimmer type is determined and determines a new dimmer type for output signal DDT only when a particular dimmer type is detected for a predetermined number of times.

For example, in at least one embodiment, to validate the detected dimmer type, dimmer detection logic 824 includes dimmer type counter 826. The dimmer type counter counts a number of times that each dimmer type of Table 1 is detected and sends a dimmer type count DTC signal to dimmer validation logic 828. Dimmer validation logic 828 determines when a particular dimmer type has been selected for a predetermined number of times. The number of times is a matter of design choice and depends on a number that accounts for an anticipated number of possible errors in the dimmer type detection over a predetermined number of cycles of the rectified supply voltage $V_{\phi\_R}$. In at least one embodiment, the predetermined number of times to validate a dimmer type is seven (7). In at least one embodiment, once a particular dimmer type has been determined for the predetermined number of times, the counters in dimmer type counter 826 are reset and the validation process is restarted.

For example, over the course of 10 consecutive cycles of the rectified supply voltage $V_{\phi\_R}$, the dimmer detection system 800 detects no dimmer 2 times, a trailing edge dimmer 2 times, and a leading edge dimmer 6 times. After the $11^{th}$ cycle of the rectified supply voltage $V_{\phi\_R}$, the dimmer detection system 800 detects a leading edge dimmer for the seventh time. Then, dimmer validation logic 828 generates the dimmer detection type signal DDT to indicate that the dimmer 504 is a leading edge type dimmer. The dimmer validation logic 828 then resets the counters of dimmer type counter 826 and does not change the status of the dimmer detection type signal DDT until either no dimmer or a trailing edge type dimmer 504 is determined seven times before a leading edge type dimmer is again detected seven times.

Figure 12:
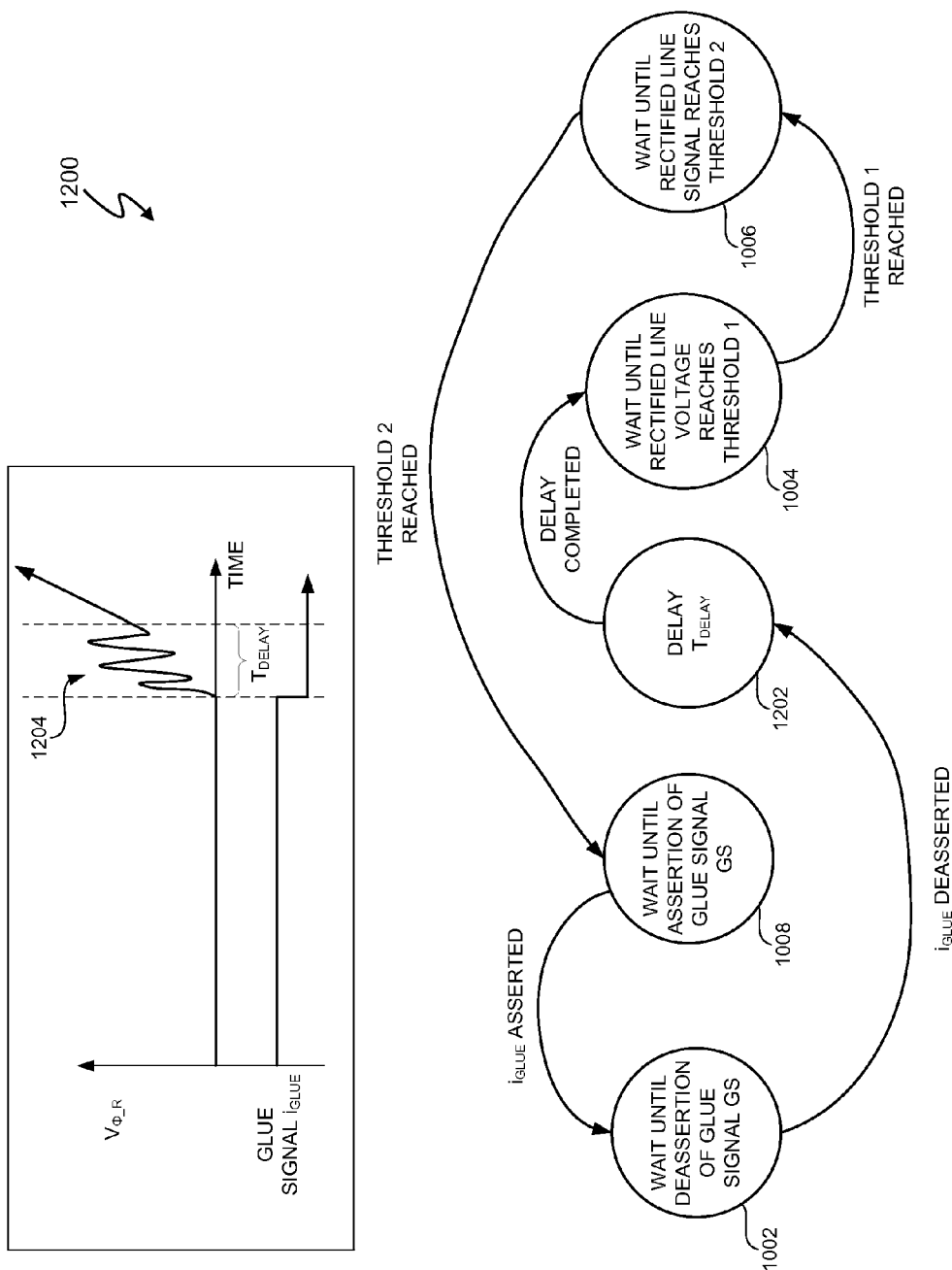
FIG. 12 depicts a state diagram for detecting a dimmer type for a 220 V+/−20%, 50 Hz supply voltage by the state machine of the dimmer detection system of FIG. 8.

FIG. 12 depicts a state diagram 1200 for detecting a dimmer type for a 220 V+/-20%, 50 Hz supply voltage by the state machine of dimmer detection system 800. The difference between state diagram 1000 (FIG. 10) and state diagram 1200 is the introduction of delay 1202 between states 1002 and 1004. In at least one embodiment, for a 220V supply voltage, the deassertion of the glue signal $i_{GLUE}$ can cause temporary fluctuations 1204, such as ringing, in the rectified supply voltage $V_{\phi\_R}$. Thus, state diagram 1200 includes a delay $T_{DELAY}$ that precedes state 1004 so that dimmer detection system 800 begins operation in state 1004 after the delay $T_{DELAY}$ in state 1202 to avoid determination of a false dimmer detection type due to the fluctuations 1204 in rectified supply voltage $V_{\phi\_R}$ causing state changes in output signals $D_{i1}$ and/or $D_{i2}$. The particular value of delay $T_{DELAY}$ is a matter of design choice, and, in at least one embodiment, is at least as long as a settling time of the fluctuations 1204.

Figure 13:
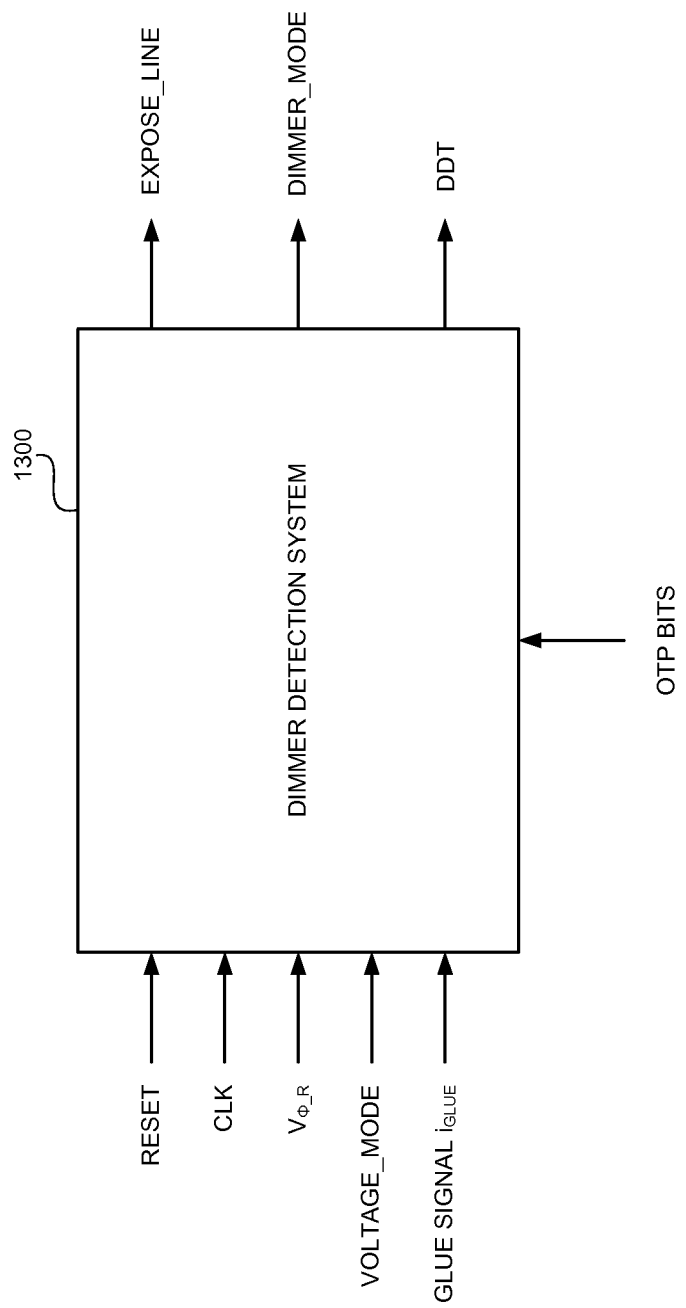
FIG. 13 depicts a digital dimmer detection system of the lighting system of FIG. 6.

FIG. 13 depicts a digital dimmer detection system 1300, which represents one embodiment of dimmer detection system 602. Referring to FIGS. 6 and 13, the digital dimmer detection system 1300 processes multiple input signals to determine: (A) if a dimmer, such as dimmer 504 is active and, thus, affecting the supply voltage $V_{SUPPLY}$ and (B) a type of dimmer 504 if dimmer 504 is active. Table 2 contains an identification of the input and output signals of digital dimmer detection system 1300 and an exemplary description:

TABLE 2

| SIGNAL | DESCRIPTION |
| --- | --- |
| RESET | Resets the output signals to a predetermined state. |
| CLK | Operating clock signal. |
| $V_{\phi\_R}$ | The rectified supply voltage $V_{\phi\_R}$. |
| VOLTAGE_MODE | A binary signal indicating the voltage of rectified supply voltage $V_{\phi\_R}$: 110V = logical 0  220V = logical 1 |
| GLUE SIGNAL $i_{GLUE}$ | The glue signal $i_{GLUE}$ that asserts when the rectified supply voltage $V_{\phi\_R}$ is approximately 0V to provide a holding current for dimmer 504 if dimmer 504 is a triac-based dimmer. |
| OTP BITS | "One Time Programmable" bits. The OTP bits allows the digital dimmer detection system 1300 to, for example, store data such as various thresholds in a memory in digital dimmer detection system 1300. |
| DIMMER_MODE | Indicates the presence or absence of a dimmer: No dimmer detected = logical 0  Dimmer detected = logical 1 |
| DDT | "Dimmer Detection Type". Indicates a type of dimmer 504: Leading Edge type = logical 0  Trailing Edge type = logical 1 |
| EXPOSE_LINE | Engages and disengages circuitry such as dimmer emulator 610 based on whether a dimmer is present and the dimmer type. |

In at least one embodiment, if dimmer 504 is actively phase cutting the supply voltage $V_{SUPPLY}$, the digital dimmer detection system 1300 generates the dimmer detection signal DIMMER_MODE to indicate whether a dimmer is affecting the supply voltage $V_{SUPPLY}$. In at least one embodiment, if the digital dimmer detection system 1300 detects a dimmer, the dimmer detection signal DIMMER_MODE is a logical 1, and, if the digital dimmer detection system 1300 does not detect a dimmer, the dimmer detection signal DIMMER_MODE is a logical 0. To determine the value of the dimmer detection signal DIMMER_MODE, the digital dimmer detection system 1300 processes the glue signal $i_{GLUE}$. If the time $GS_{TIME}$ that the glue signal $i_{GLUE}$ is asserted is greater than a glue signal threshold time $GS_{TIME\_TH}$, then an active dimmer 504 is detected, and digital dimmer detection system 1300 sets the dimmer detection signal DIMMER_MODE to a logical 1. If the time $GS_{TIME}$ that the glue signal $i_{GLUE}$ is asserted is less than a glue signal threshold time $GS_{TIME\_TH}$, then no dimmer is detected, and digital dimmer detection system 1300 sets the dimmer detection signal DIMMER_MODE to a logical 0.

The digital dimmer detection system 1300 processes the rectified supply voltage $V_{\phi\_R}$ to determine a value of the dimmer detection type signal DDT to indicate to controller 604 a type of dimmer 504. The VOLTAGE_MODE signal indicates to the digital dimmer detection system 1300 if the rectified supply voltage $V_{\phi\_R}$ is 110V or 220V to allow the dimmer detection system to select respective thresholds and delays. The OTP bits allow entry of data into the dimmer detection system 1300. Exemplary data includes predetermined thresholds, such as the glue signal threshold time $GS_{TIME\_TH}$, voltage thresholds, and one or more delay times. In at least one embodiment, the OTP bits are stored in a memory (not shown), such as a register, in the dimmer detection system 1300.

The digital dimmer detection system 1300 provides the DIMMER_MODE and DDT signals to controller 604 (FIG. 6) to allow controller 604 to operate efficiently by, for example, disabling dimmer emulator 610 when no dimmer is detected or a trailing edge type dimmer is detected. The digital dimmer detection system 1300 asserts the EXPOSE_LINE signal to suspend the generation of an emulated supply voltage by dimmer emulator 610 when the digital dimmer detection system 1300 is processing data to detect an active dimmer and determine a dimmer type. In at least one embodiment, when the generation of the emulated supply voltage is suspended, controller 604 causes the power converter system 605 to boost the rectified supply voltage $V_{\phi\_R}$. Suspending generation of the emulated supply voltage and boosting the rectified supply voltage $V_{\phi\_R}$ allows the digital dimmer detection system 1300 to sample actual values of rectified supply voltage $V_{\phi\_R}$. Generation of an emulated supply voltage is described in detail in Dimmer Output Emulation.

Figure 14:
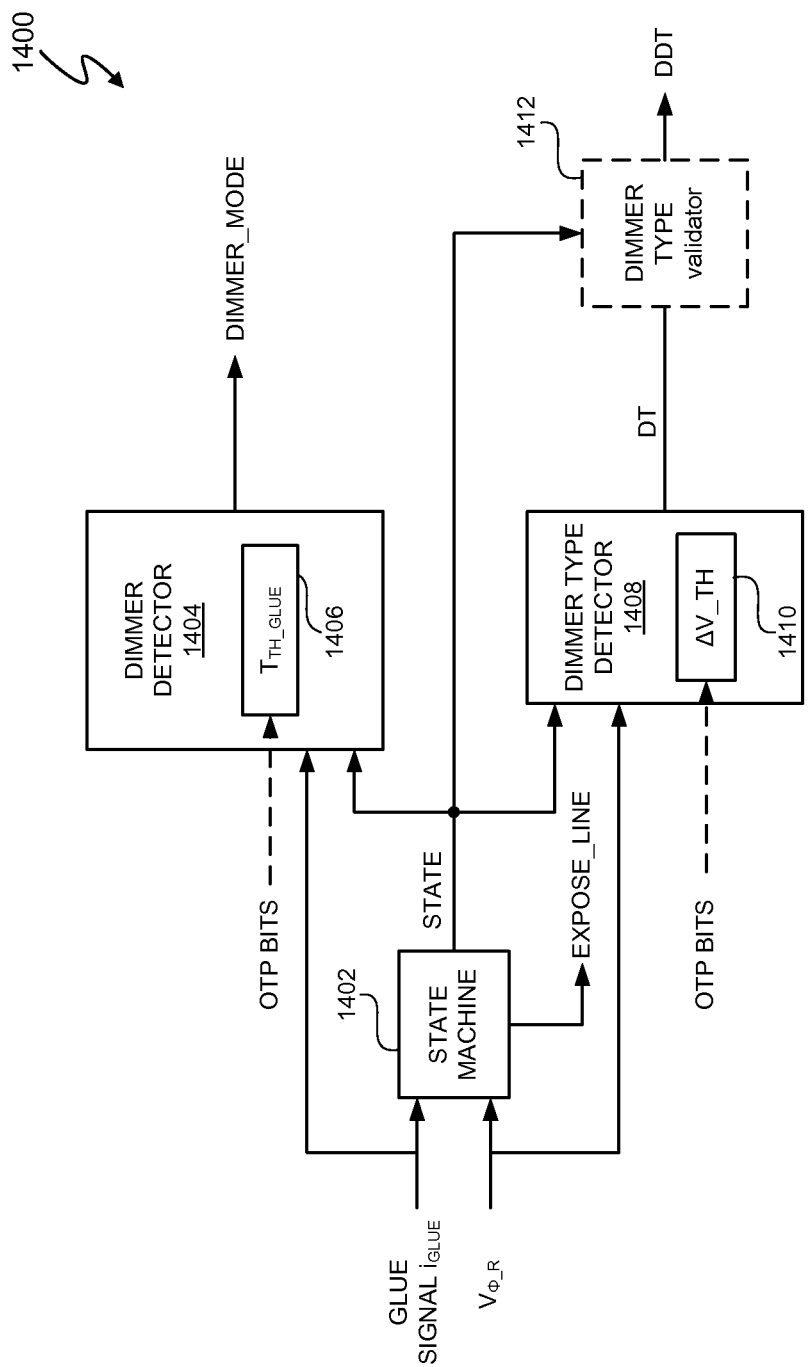
FIG. 14 depicts an embodiment of the digital dimmer detection system of FIG. 13.
Figure 15:
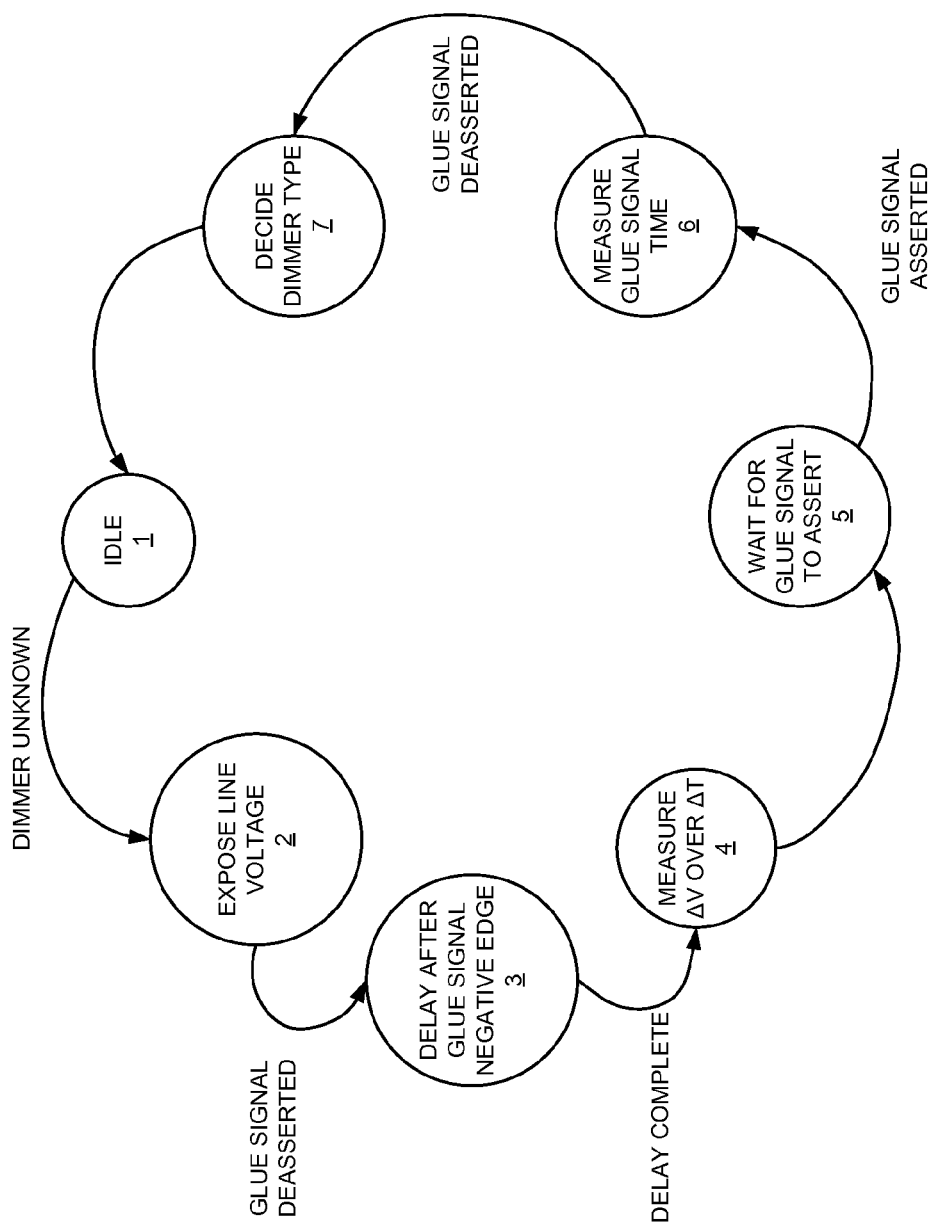
FIG. 15 depicts an exemplary dimmer detection type state diagram for the digital dimmer detection system of FIG. 14.
Figure 16:
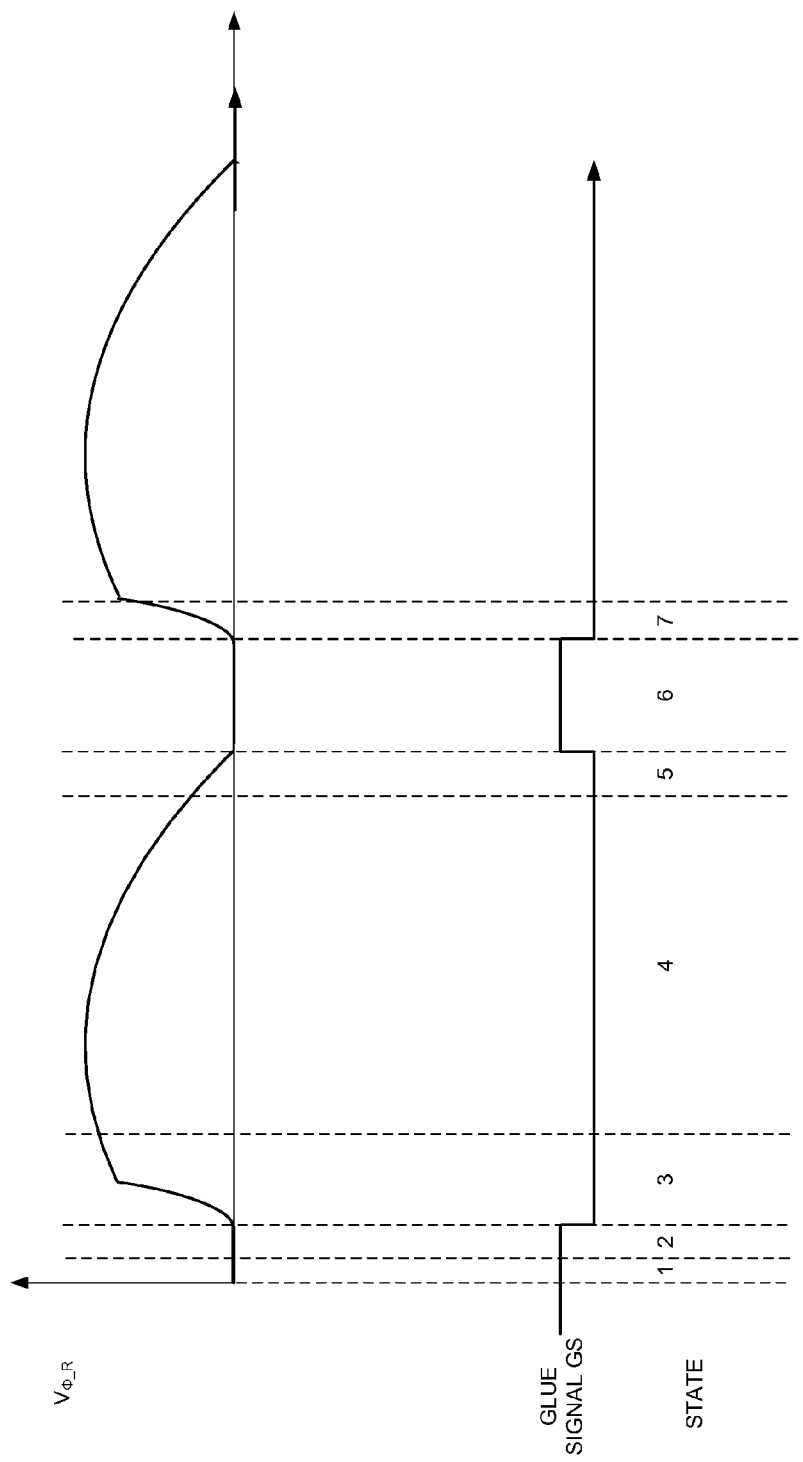
FIG. 16 depicts exemplary signals associated with trailing edge type detection mode and correlated states of the state machine in FIG. 14.

FIG. 14 depicts a digital dimmer detection system 1400, which represents one embodiment of the digital dimmer detection system 1300. The digital dimmer detection system 1400 includes a state machine 1402 to control operation of the digital dimmer detection system 1400. FIG. 15 depicts an exemplary dimmer detection and dimmer detection type state diagram 1500 for positively detecting an active phase cutting dimmer 504, positively detecting a trailing edge phase cut of the rectified supply voltage $V_{\phi\_R}$, and implicitly detecting a leading edge phase cut of the rectified supply voltage $V_{\phi\_R}$. In at least one embodiment, the state machine 1402 operates in accordance with the state diagram 1500. FIG. 16 depicts exemplary signals associated with trailing edge type detection mode and correlated states of the state machine 1402 corresponding to an exemplary operation of digital dimmer detection system 1400. An exemplary operation of the digital dimmer detection system 1400 is subsequently discussed with reference to state diagram 1500 and the signals and states of FIG. 16.

Referring to FIGS. 14, 15, and 16, the digital dimmer detection system 1400 monitors the glue signal $i_{GLUE}$ and the rectified supply voltage $V_{\phi\_R}$ to detect an active dimmer 504 and determine a type of dimmer 504 if dimmer 504 is actively phase cutting the rectified supply voltage $V_{\phi\_R}$. In at least one embodiment, the digital dimmer detection system 1400 is configured to positively detect a trailing edge phase cut because, for example, trailing edge phase cuts are generally "cleaner", i.e. have less perturbations or other disturbances, than leading edge phase cuts when asserting the glue signal $i_{GLUE}$. The state machine 1402 receives the glue signal $i_{GLUE}$ and the rectified supply voltage $V_{\phi\_R}$.

In state 1 of state diagram 1500, the state machine 1402 is initially idle. In state 2, the state machine 1402 generates the EXPOSE_LINE signal and provides the EXPOSE_LINE signal to controller 604 (FIG. 6), and controller 604 suspends generation of an emulated supply voltage signal $E_S$ (FIG. 6). Suspending the emulated supply voltage signal $E_S$ allows the digital dimmer detection system 1400 to monitor the actual rectified supply voltage $V_{\phi\_R}$. In at least one embodiment, dimmer detector 1404 is identical to dimmer detector 802 (FIG. 8) and detects dimmer 504 if the glue signal $i_{GLUE}$ exceeds a predetermined time threshold $T_{TH\_GLUE}$ (FIG. 8).

The dimmer detection signal DIMMER_MODE indicates the presence or absence of dimmer 504 in accordance with the states specified in Table 2. In at least one embodiment, the time threshold $T_{TH\_GLUE}$ is stored in a register 1406. In at least one embodiment, the value of time threshold $T_{TH\_GLUE}$ is optionally (indicated by a dashed line) entered into the register 1406 via the OTP BITS. In at least one embodiment, the state machine 1500 proceeds to state 3 regardless of whether a dimmer is detected in state 2.

In at least one embodiment, deassertion of glue signal $i_{GLUE}$ can cause temporary fluctuations (such as the fluctuations 1204 (FIG. 12) of the rectified supply voltage $V_{\phi\_R}$. Thus, in state 3, state machine 1402 delays detection of the dimmer type by dimmer type detector 1408 until the fluctuations sufficiently settle to allow detection of a type of dimmer 504 (FIG. 6) by dimmer type detector 1408. The particular duration of delay in state 3 is a matter of design choice and depends on anticipated duration of the fluctuations of the rectified supply voltage $V_{\phi\_R}$. In at least one embodiment, the delay in state 3 exceeds the anticipated duration of fluctuations of the rectified supply voltage $V_{\phi\_R}$ while allowing the dimmer type detector 1408 sufficient opportunity to detect a type of dimmer 504 for a minimum phase cut angle, such as 10°.

During state 4, the dimmer type detector 1408 monitors the rectified supply voltage $V_{\phi\_R}$ and, in at least one embodiment, continuously determines a slope of the rectified supply voltage $V_{\phi\_R}$. In at least one embodiment, the slope of rectified supply voltage $V_{\phi\_R}$ is determined by comparing a difference $\Delta V$ between two consecutive sampled values of the rectified supply voltage $V_{\phi\_R}$ during a fixed period of time $\Delta T$ with a voltage difference threshold value $\Delta V\_TH$. Thus, the dimmer type detector 1408 determines $\Delta V/\Delta T$, which represents the slope the rectified supply voltage $V_{\phi\_R}$. For example, a voltage difference $\Delta V$ greater than the voltage difference threshold value $\Delta V\_TH$ indicates a first type of dimmer, such as a leading edge dimmer when analyzing a leading edge of the rectified supply voltage $V_{\phi\_R}$. For example, a voltage difference $\Delta V$ less than the voltage difference threshold value $\Delta V\_TH$ indicates a second type of dimmer, such as a trailing edge dimmer, when analyzing a leading edge of the rectified supply voltage $V_{\phi\_R}$ or indicates no dimmer.

In at least one embodiment, the slope of the rectified supply voltage $V_{\phi\_R}$ is determined by determining an amount of time $\Delta T_{ELAPSED}$ that elapses between reaching a first threshold voltage (such as rectified supply voltage $V_{\phi\_R\_TH1}$ (FIG. 11) and a second threshold voltage (such as rectified supply voltage $V_{\phi\_R\_TH2}$ (FIG. 11). If the elapsed time $\Delta T_{ELAPSED}$ is less than a predetermined threshold time $T_{TH}$, then dimmer detector 1408 determines the $\Delta V/\Delta T$, which also represents the slope of the rectified supply voltage $V_{\phi\_R}$. In at least one embodiment, the values of $V_{\phi\_R\_TH1}$, $V_{\phi\_R\_TH2}$, and $\Delta T_{ELAPSED}$ are stored in the dimmer detection system 1300 (FIG. 13) using OTP bits.

The state machine 1402 enters state 5 and waits for the next assertion of the glue signal $i_{GLUE}$ while the dimmer type detector 1408 continues to determine the slope of rectified supply voltage $V_{\phi\_R}$. When the glue signal is asserted, the state machine 1402 moves to state 6. In state 6, the state machine 1402 measures the duration of the glue signal. A duration of glue signal less than a predetermined threshold of time indicates that no dimmer is present. When the glue signal $i_{GLUE}$ is deasserted, the state machine 1402 enters state 7 and causes the dimmer type detector 1408 to determine a type of detector 504 and generate a dimmer type signal DT indicating the determined dimmer type. In at least one embodiment, if at any time in state 4 the dimmer type detector 1408 determines that $\Delta V$ is greater than $\Delta V\_TH$, dimmer type detector 1408 generates the dimmer type signal DT to indicate that dimmer 504 is a trailing edge type dimmer.

If during state 4 the dimmer type detector 1408 does not determine that ΔV is greater than the threshold voltage difference ΔV_TH, then dimmer type detector 1408 generates the dimmer type signal DT to indicate that dimmer 504 is a leading edge type dimmer. In at least one embodiment, a dimmer type signal DT of logical 1 indicates a trailing edge type dimmer, and a dimmer type signal DT of logical 0 indicates a leading edge type dimmer. In at least one embodiment, the threshold voltage difference ΔV_TH is stored in a register 1410. In at least one embodiment, the value of threshold voltage difference ΔV_TH is optionally (indicated by a dashed line) entered into the register 1410 via the OTP BITS.

In at least one embodiment, digital dimmer detection system 1400 includes an optional dimmer type validator 1412 to validate the dimmer type determination by dimmer type detector 1408. In at least one embodiment, the dimmer type validator 1412 is included in digital dimmer detection system 1400 to increase the probability of an accurate determination of a dimmer type of dimmer 504. In at least one embodiment, the dimmer 504 does not always reliably and cleanly phase cut each cycle of the rectified supply voltage $V_{\phi\_R}$. For example, the rectified supply voltage $V_{\phi\_R}$ is not always a clean (i.e. undisturbed other than a phase cut) signal, and occasionally the dimmer 504 can skip a phase cut of the rectified supply voltage $V_{\phi\_R}$ when the dimmer 504 should be phase cutting the rectified supply voltage $V_{\phi\_R}$.

In at least one embodiment, the dimmer type validator 1412 validates a dimmer type if the dimmer type signal DT indicates the same type of dimmer X consecutive times in a row. "X" represents the number of times, and, in at least one embodiment, the value of "X" is entered into a memory (not shown) of digital dimmer detection system 1400 as one of the OTP values. In at least one embodiment, the value of "X" is chosen between 1 and 4. The dimmer type validator 1412 generates the detected dimmer type signal DDT representing a validated dimmer type and provides the detected dimmer type signal DDT for controller 604 (FIG. 6).

Although digital dimmer detection system 1400 has been described as positively detecting a trailing edge type dimmer, the digital dimmer detection system 1400 can be modified to detect a leading edge type dimmer by, for example, determining the slope ΔV/ΔT of the rectified supply voltage $V_{\phi\_R}$ directly after deassertion of the glue signal $i_{GLUE}$ and determining if the change in the rectified supply voltage $V_{\phi\_R}$ indicates an abrupt change in the rectified supply voltage $V_{\phi\_R}$ corresponding to a phase cut.

Figure 17:
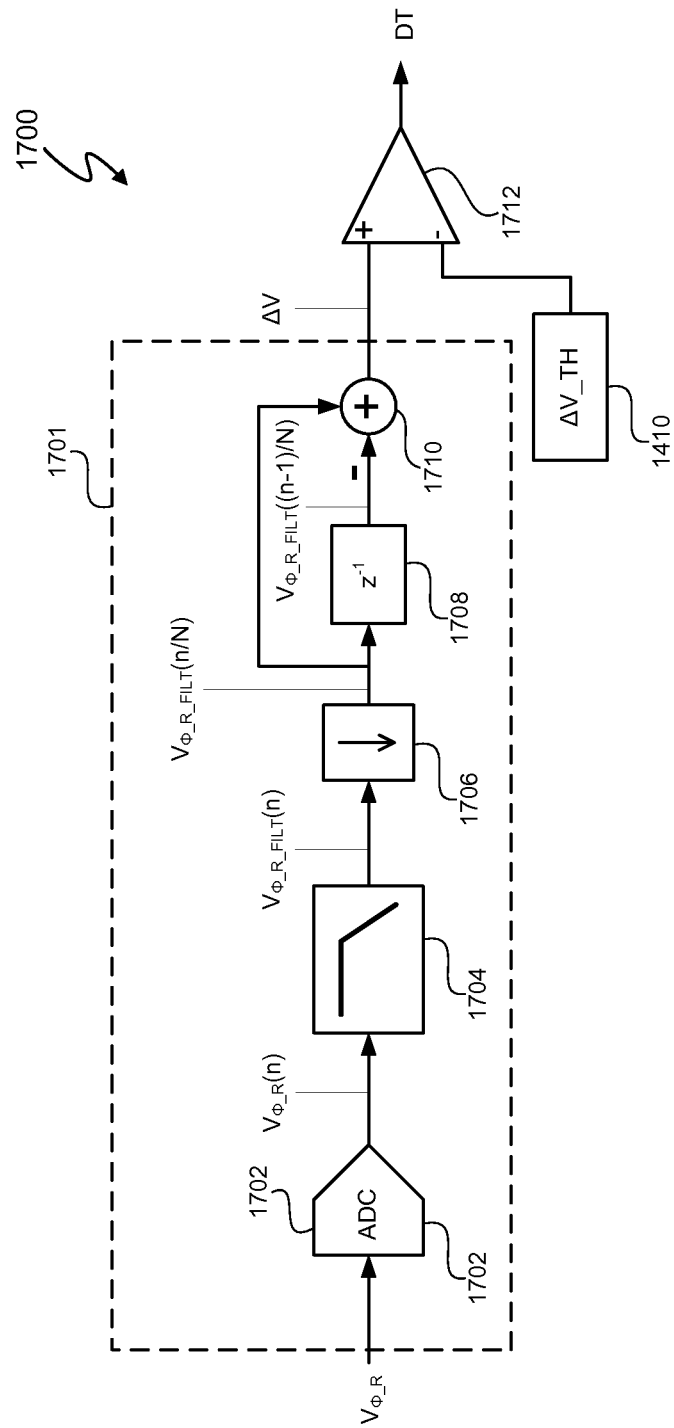
FIG. 17 depicts an embodiment of a dimmer type detector of the digital dimmer detection system of FIG. 14.

FIG. 17 depicts dimmer type detector 1700, which represents one embodiment of dimmer type detector 1408. The dimmer type detector 1700 includes a ΔV in Δt measurement module 1701 to measure a change rectified supply voltage $V_{\phi\_R}$ over a change in time for detection of an abrupt change in rectified supply voltage $V_{\phi\_R}$. An analog-to-digital converter (ADC) 1702 receives the analog rectified supply voltage $V_{\phi\_R}$ and converts the rectified supply voltage $V_{\phi\_R}$ into a digital voltage signal $V_{\phi\_R}(n)$, where "n" is a sample index number. Low pass filter 1704 filters the digital voltage signal $V_{\phi\_R}(n)$ to generate a filtered rectified supply voltage $V_{\phi\_R\_FILT}(n)$. In at least one embodiment, the low pass filter has a 3 dB cut off frequency of 3 kHz. Downsampler 1706 downsamples the filtered, rectified supply voltage $V_{\phi\_R\_FILT}(n)$ from, for example, 1 MHz ($f_{S0}$) to between 10 kHz and 50 kHz ($f_{S1}$) to generate the filtered, rectified supply voltage $V_{\phi\_R\_FILT}(n/N)$, where "1/N" represents the frequency downsampling fraction $f_{S0}/f_{S1}$. The particular value of frequency $f_{s1}$ is programmable using the OTP bits (FIG. 13). Delay $z^{-1}$ delays $V_{\phi\_R\_FILT}(n/N)$ by one sample to generate $V_{\phi\_R\_FILT}((n-1)/N)$. Adder 1710 adds $V_{\phi\_R\_FILT}(n/N)$ to $-V_{\phi\_R\_FILT}((n-1)/N)$ to generate a voltage difference sample ΔV between the two consecutive sampled values of the rectified supply voltage $V_{\phi\_R}$. Comparator 1712 compares the voltage difference sample ΔV with a threshold voltage difference ΔV_TH and generates dimmer type signal DT based on the outcome of the comparison.

If the voltage difference sample ΔV is greater than the threshold voltage difference ΔV_TH, the rectified supply voltage $V_{\phi\_R}$ has an abrupt change at a trailing edge of rectified supply voltage $V_{\phi\_R}$. An abrupt change in the trailing edge of rectified supply voltage $V_{\phi\_R}$ indicates a presence of a trailing edge dimmer. In at least one embodiment, the non-inverting terminal of comparator 1712 receives the voltage difference signal ΔV, and the inverting terminal receives the threshold voltage difference ΔV_TH. Accordingly, in this embodiment, when the dimmer type signal DT output of comparator 1712 is a logical 1, the logical 1 indicates a trailing edge type dimmer Conversely, a dimmer type signal DT of logical 0 indicates a leading edge type dimmer or no dimmer. The dimmer type detector 1700 is depicted functionally and can be implemented using analog, digital, or mixed analog and digital circuitry.

Figure 18:
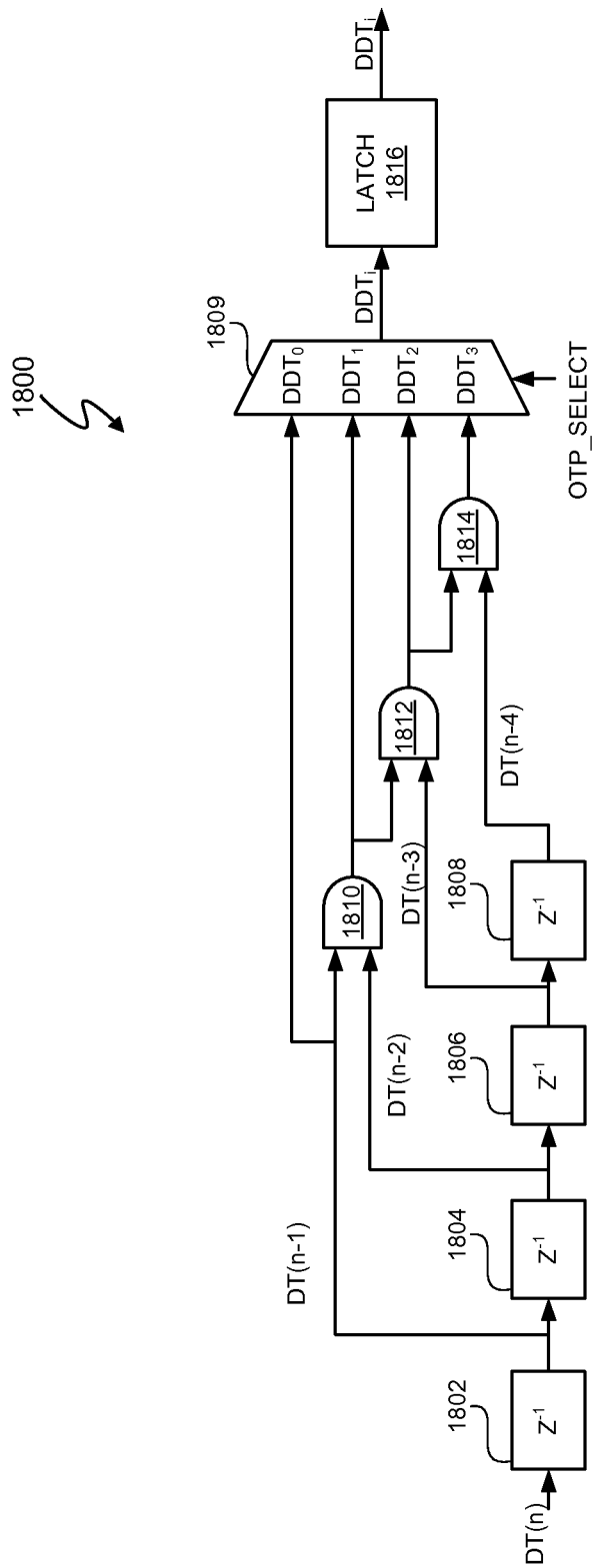
FIG. 18 depicts a dimmer type validator.

FIG. 18 depicts dimmer type validator 1800, which represents one embodiment of dimmer type validator 1412. The dimmer type validator 1800 validates the type of dimmer by confirming that the dimmer type signal DT(n) indicates the same type of dimmer at least "M" times in a row. "n" is an index. The value of "M" is programmable and is, for example, set by an OTP bits (FIG. 13) to specify the value of the multiplexer select signal OTP_SELECT. A first delay element 1802, represented by the z-domain nomenclature $Z^{-1}$, receives the dimmer type signal DT. The first delay element 1802 is connected in series with three other delay elements 1804, 1806, and 1808. Each delay element 1802-1808 is updated once per cycle of dimmer type validator 1800. A dimmer type signal DT(n-1) of the first delay element 1802 is the value of the immediately preceding dimmer type signal, a dimmer type signal DT(n-2) of the second delay element 1804 represents the value of the dimmer type signal two cycles ago, and so on. Thus, dimmer type signals DT(n-1), DT(n-2), DT(n-3), and DT(n-4) represent 4 consecutive values of the dimmer type signal DT.

A 4×1 multiplexer 1809 receives the dimmer type signal DT(n-1) as the first dimmer type signal $DDT_0$. The remaining dimmer type signals $DDT_1$, $DDT_2$, and $DDT_3$ are the respective output signals of logic AND gates 1810, 1812, and 1814. The output $DDT_1$ of AND gate 1810 is a logical 1 only if both dimmer type signals DT(n-1) and DT(n-2) are the same, and, thus, represent the same dimmer type. The output $DDT_2$ of AND gate 1812 is a logical 1 only if all three dimmer type signals DT(n-1), DT(n-2), and DT(n-3) are the same. The output $DDT_3$ of AND gate 1814 is a logical 1 only if all four dimmer type signals DT(n-1), DT(n-2), DT(n-3), and DT(n-4) are the same. The value of OTP_SELECT multiplexer output select signal determines which dimmer type signal of multiplexer 1809 is latched by latch 1816. For validation requiring 2 consecutive, uniform determinations of the dimmer type, the OTP_SELECT signal is set to 2. For validation requiring 3 consecutive, uniform determinations of the dimmer type, the OTP_SELECT multiplexer output select signal is set to 3, and so on. In at least one embodiment, the OTP_SELECT multiplexer output select signal is set to 4 so that $DDT_i$ equals $DDT_3$. Latch 1816 stores the value of $DDT_i$ and provides the value of $DDT_i$ as the dimmer detection type signal DDT in FIG. 14.

Figure 19:
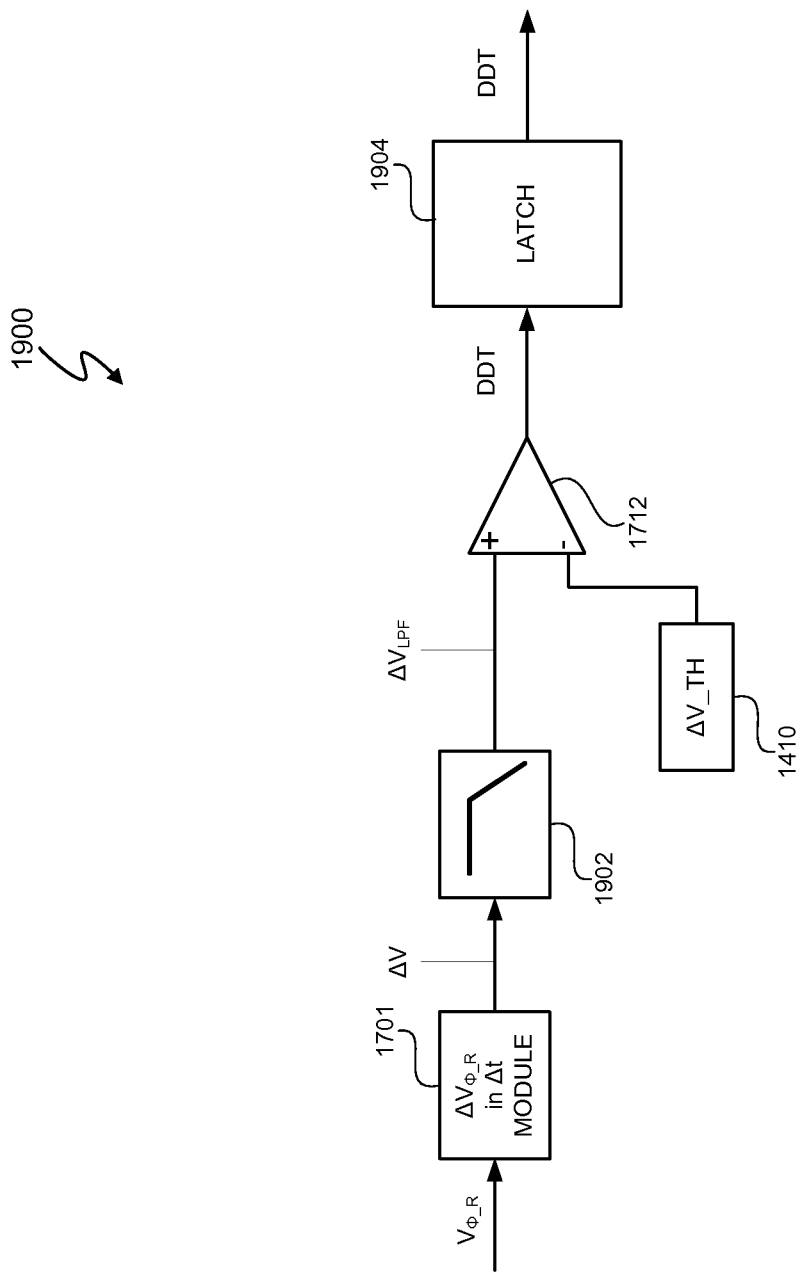
FIG. 19 depicts an embodiment of a dimmer type detector of the digital dimmer detection system of FIG. 14.

FIG. 19 depicts dimmer type detector 1900, which represents another embodiment of dimmer type detector 1408. The ΔV in Δt measurement module 1701 determines the voltage difference sample ΔV as described with reference to FIG. 17. Following the ΔV in Δt measurement module 1701 is a low pass filter 1902, which low pass filters the voltage difference sample ΔV. In at least one embodiment, the 3 dB corner frequency is greater than $1/(2 \cdot \Delta T_{OPER})$, and $\Delta T_{OPER}$ is an operating frequency of dimmer type detector 1900. The low pass filter 1902 has a 3 dB corner frequency that effectively removes transient voltages from rectified supply voltage $V_{\phi\_R}$. Since such transient voltages generally have a frequency significantly greater than the nominal frequency (e.g. 220 Hz or 440 Hz) of rectified supply voltage $V_{\phi\_R}$, the low pass filter 1902 performs an effective validation of the dimmer by filtering out transient voltages that might alter a dimmer type determination.

The low pass filter provides a digital output signal $\Delta V_{LPF}$, which is the low pass filtered version of the voltage difference sample ΔV from ΔV in Δt measurement module 1701. Comparator 1712 compares the digital output signal $\Delta V_{LPF}$ with a threshold voltage difference $\Delta V\_TH$ and generates dimmer type signal DT based on the outcome of the comparison in the same manner as the comparison of the voltage difference sample ΔV with the threshold voltage difference $\Delta V\_TH$ described in conjunction with FIG. 17. Latch 1904 stores the dimmer type signal DDT. The latch 1904 represents one embodiment of a latch that can be used to store the dimmer type signal DDT. Any latch, such as a D flip-flop can also be used.

Thus, in at least one embodiment, a lighting system includes a dimmer detection system. In at least one embodiment, the dimmer detection system detects a presence of a dimmer and identifies the type of dimmer.

Although embodiments have been described in detail, it should be understood that various changes, substitutions, and alterations can be made hereto without departing from the spirit and scope of the invention as defined by the appended claims.

What is claimed is:

1. A method comprising:
   receiving an input signal representing a supply voltage signal;
   detecting a dimmer affecting the supply voltage signal;
   generating a dimmer detection signal representing detection of the dimmer;
   determining a type of the dimmer affecting the supply voltage; and
   generating a dimmer type detection signal;
   wherein determining a type of the dimmer affecting the supply voltage comprises at least one of (A) and (B):
   (A) comparing the input signal with a first threshold value;
       comparing the input signal with a second threshold value;
       determining a time between when the input signal reaches the first threshold value and the input signal reaches the second threshold value;
       comparing the determined time with a time threshold value; and
       indicating that the dimmer is a first type of dimmer if the determined time is above the time threshold value and indicating the dimmer is a second type of dimmer if the determined time is below the time threshold value;
   (B) determining a voltage difference in the input signal that occurs during a fixed amount of time;
       comparing the voltage difference in the input signal to a voltage difference threshold value; and
       indicating that the dimmer is a first type of dimmer if the voltage difference is greater than the voltage difference threshold value and indicating the dimmer is a second type of dimmer if the voltage difference is greater than the voltage difference threshold value.

2. The method of claim 1 further comprising:
   utilizing an analog circuit to determine the dimmer detection signal and the dimmer type detection signal.

3. The method of claim 1 further comprising:
   utilizing a digital circuit to determine the dimmer detection signal and the dimmer type detection signal.

4. The method of claim 1 further comprising:
   utilizing the dimmer detection signal and dimmer type detection signal by a controller of a switching power converter to operate a dimmer emulator.

5. The method of claim 1 further comprising:
   validating the determined type of dimmer.

6. The method of claim 5 wherein validating the determined type of dimmer comprises:
   determining if the determined type of dimmer is consistent over multiple cycles of the supply voltage signal.

7. The method of claim 1 wherein detecting if a dimmer is affecting the supply voltage comprises:
   generating a glue signal when the input signal is below a minimum threshold value; and
   determining if a duration of the glue signal indicates that the dimmer is affecting the supply voltage signal.

8. The method of claim 1 wherein the supply voltage signal comprises a rectified line input voltage to a switching power converter.

9. The method of claim 1 wherein the dimmer is a triac-based dimmer.

10. An apparatus comprising:
    a dimmer detection system to:
        receive an input signal representing a supply voltage signal;
        detect a dimmer affecting the supply voltage signal;
        generate a dimmer detection signal representing detection of the dimmer;
        determine a type of the dimmer affecting the supply voltage; and
        generate a dimmer type detection signal;
    wherein to determine a type of the dimmer affecting the supply voltage, the dimmer detection system is capable to perform at least one of (A) and (B):
    (A) compare the input signal with a first threshold value;
        compare the input signal with a second threshold value;
        determine a time between when the input signal reaches the first threshold value and the input signal reaches the second threshold value;
        compare the determined time with a time threshold value; and
        indicate that the dimmer is a first type of dimmer if the determined time is above the time threshold value and indicating the dimmer is a second type of dimmer if the determined time is below the time threshold value;
    (B) compare the input signal with a first threshold value;
        determine a voltage difference in the input signal that occurs during a fixed amount of time;
        compare the voltage difference in the input signal to a voltage difference threshold value; and indicate that the dimmer is a first type of dimmer if the voltage difference is greater than the voltage difference threshold value and indicating the dimmer is a second type of dimmer if the voltage difference is greater than the voltage difference threshold value.

11. The apparatus of claim 10 wherein the dimmer detection system comprises digital circuits, the apparatus further comprising:
a controller to control switching power converter, wherein the controller comprises an integrated circuit that includes the dimmer detection system.

12. The apparatus of claim 10 wherein the dimmer detection system comprises an analog circuit.

13. The apparatus of claim 10 wherein the dimmer detection system is further capable of:
utilizing an analog circuit to determine the dimmer detection signal and the dimmer type detection signal.

14. The apparatus of claim 10 further comprising:
a controller coupled to the dimmer detection system, wherein the controller is capable of utilizing the dimmer detection signal and dimmer type detection signal to operate a dimmer emulator.

15. The apparatus of claim 10 wherein the dimmer detection system is further capable of:
validating the determined type of dimmer.

16. The apparatus of claim 15 wherein validating the determined type of dimmer comprises determining if the determined type of dimmer is consistent over multiple cycles of the supply voltage signal.

17. The apparatus of claim 10 further comprising:
a controller to generate a glue signal when the input signal is below a minimum threshold value;
wherein the dimmer detection system is capable of determining if a duration of the glue signal indicates that the dimmer is affecting the supply voltage signal.

18. The apparatus of claim 17 wherein the glue signal prevents a triac-based dimmer from misfiring.

19. The apparatus of claim 10 wherein the supply voltage signal comprises a rectified line input voltage to a switching power converter.

20. The apparatus of claim 10 wherein the dimmer is a triac-based dimmer.

21. An apparatus comprising:
a power converter system to convert a supply voltage signal into an output voltage; and
a controller, coupled to the power converter system to control the power converter system, wherein the controller includes a dimmer detection system, wherein the dimmer detection system includes:
one or more input terminals to receive an input signal representing a supply voltage signal;
a dimmer detector to detect if a dimmer is affecting the supply voltage signal and generate a dimmer detection signal representing detection of the dimmer; and
a dimmer type detector to determine a type of the dimmer affecting the supply voltage and generate a dimmer type detection signal, wherein to determine a type of the dimmer affecting the supply voltage, the dimmer type detector is capable to perform at least one of (A) and (B):
(A) compare the input signal with a first threshold value;
compare the input signal with a second threshold value;
determine a time between when the input signal reaches the first threshold value and the input signal reaches the second threshold value;
compare the determined time with a time threshold value; and
indicate that the dimmer is a first type of dimmer if the determined time is above the time threshold value and indicating the dimmer is a second type of dimmer if the determined time is below the time threshold value;
(B) compare the input signal with a first threshold value;
determine a voltage difference in the input signal that occurs during a fixed amount of time;
compare the voltage difference in the input signal to a voltage difference threshold value; and
indicate that the dimmer is a first type of dimmer if the voltage difference is greater than the voltage difference threshold value and indicating the dimmer is a second type of dimmer if the voltage difference is greater than the voltage difference threshold value.

22. The apparatus of claim 21 wherein the dimmer detection system further comprises a dimmer validater to validate the type of dimmer.

23. The apparatus of claim 21 wherein the dimmer detection system operates in accordance with a state machine.

24. The apparatus of claim 21 wherein the power converter system is a member of a group consisting of: a buck-type switching power converter, boost-type switching power converter, buck-boost switching power converter, and a Cúk-type switching power converter.

25. The apparatus of claim 21 further comprising a load coupled to the switching power converter.

26. The apparatus of claim 21 wherein the load comprises one or more members of a group consisting of one or more light emitting diodes, one or more fluorescent light sources, one or more motors, and one or more portable power sources.

* * * * *